United States Patent [19]

Blanchard et al.

[11] Patent Number: 5,319,541

[45] Date of Patent: Jun. 7, 1994

[54] MACHINE-AIDED METHOD FOR THE SELECTION OF ROOFING SYSTEMS AND THE GENERATION OF SPECIFICATIONS THEREOF

[75] Inventors: William K. Blanchard, Joplin; Helene Hardy-Pierce, Kansas City, both of Mo.; William Shipman, Joplin, Mo.; Kenny R. Beam, Jr., Nashville, Tenn.; Vernon McIntyre, Allen, Tex.

[73] Assignee: Tamko Asphalt Products, Joplin, Mo.

[21] Appl. No.: 494,181

[22] Filed: Mar. 15, 1990

[51] Int. Cl.⁵ ............................................. G06F 15/22
[52] U.S. Cl. ..................................... 364/401; 364/403; 364/512
[58] Field of Search ............... 364/401, 402, 403, 512, 364/513; 395/50, 51

[56] References Cited

U.S. PATENT DOCUMENTS

| | | | |
|---|---|---|---|
| 4,370,707 | 1/1983 | Phillips et al. | 364/200 |
| 4,835,683 | 5/1989 | Phillips et al. | 364/200 |
| 5,065,338 | 11/1991 | Phillips et al. | 395/51 |

FOREIGN PATENT DOCUMENTS 8215786 2/1983 United Kingdom .

Primary Examiner—Roy N. Envall, Jr.
Assistant Examiner—Khai Tran
Attorney, Agent, or Firm—Arnold, White & Durkee

[57] ABSTRACT

A machine-aided method for selecting roofing systems to match particular building roof design features. Logic branches are employed to guide a machine to the determination of an appropriate roofing system on the basis of design feature data entered by a user. Apparatus for specification generation are also disclosed wherein a roofing specification may be generated which corresponds to the selected roofing system. An illustrative example is also described.

8 Claims, 45 Drawing Sheets

Microfiche Appendix Included
(19 Microfiche, 1130 Pages)

FLOWCHART USE: PART I

MASTER GUIDE OF FLOWCHART CHOICES

A. Guarantees, Yrs.

$A_1$ - 5, 10, none
   $A_2$ - 15
   $A_3$ - 20
   $A_4$ - 12

B. Slope, "/12"

$B_1$ - 1/4, 1/2, 3/4
   $B_2$ - 1
   $B_3$ - 1 1/2, 3
   $B_4$ - 1, 1 1/2, 3
   $B_5$ - Any slope C. Gypsum Board $C_1$ - Yes
   $C_2$ - No D. Vapor Retarder $D_1$ - Yes
   $D_2$ - No F. Layers of Insulation $F_1$ - 1
   $F_2$ - 2
   $F_3$ - 3
   $F_4$ - None G. 1st Layer of Insulation $G_1$ - Perlite, Fiberglass, Woodfiber, Foamglass, Composite, Isocyanurate
   $G_2$ - Perlite, Fiberglass, Woodfiber, Foamglass, Composite, Isocyanurate, EPS, Phenolic
   $G_3$ - Perlite, Fiberglass, Woodfiber, Composite H. 1st Layer Attachment $H_1$ - Mechanical Attachment, Hot Asphalt
   $H_2$ - Hot Asphalt

FIGURE 1A

MASTER GUIDE OF FLOWCHART CHOICES (cont.)

I. 1st Layer Attachment Chosen $I_1$ - Mechanical Attachment
  $I_2$ - Hot Asphalt J. 2nd Layer of Insulation $J_1$ - Perlite, Fiberglass, Woodfiber, Foamglass, Composite, Isocyanurate
  $J_2$ - Perlite, Fiberglass, Woodfiber, Foamglass, Composite, Isocyanurate, EPS, Phenolic
  $J_3$ - Perlite, Fiberglass, Woodfiber, Foamglass, Composite K. 2nd Layer Attachment $K_1$ - Mechanical Attachment, Hot Asphalt
  $K_2$ - Hot Asphalt L. 3rd Layer of Insulation L - Perlite, Fiberglass, Woodfiber, Foamglass M. 3rd Layer Attachment M - Hot Asphalt N. System Type $N_1$ - Built-Up Roofing
  $N_2$ - Modified Asphalt O. Built-Up Roofing Type $O_1$ - Organic
  $O_2$ - Fiberglass P. Ply Sheet Type $P_1$ - Tam-Glass Premium (VI)
  $P_2$ - Tam-Ply-IV (IV)

Q. Surfacing $Q_1$ - Flood Coat and Gravel
  $Q_2$ - Smooth
  $Q_3$ - Cap Sheet

FIGURE 1B

MASTER GUIDE OF FLOWCHART CHOICES (cont.)

R. Applicable Built-Up Roofing System(s)

$R_1$ - 501, 503  $R_2$ - 504, 505
$R_3$ - 502      $R_4$ - 506
$R_5$ - 601, 603  $R_6$ - 604, 605
$R_7$ - 602      $R_8$ - 606
$R_9$ - 401, 402  $R_{10}$ - 503
$R_{11}$ - 603   $R_{12}$ - 412
$R_{13}$ - 514   $R_{14}$ - 516
$R_{15}$ - 512   $R_{16}$ - 614
$R_{17}$ - 616   $R_{18}$ - 612
$R_{19}$ - 515   $R_{20}$ - 615

S. Modified Asphalt Application Type $S_1$ - Heat Weld
$S_2$ - Hot Asphalt

T. Modified Asphalt Type $T_1$ - Premium
$T_2$ - 170

U. Applicable Modified Asphalt Roofing System(s)

MASTER GUIDE OF FLOWCHART CHOICES (cont.)

$U_{23}$ - 132
$U_{24}$ - 232
$U_{25}$ - 134hw
$U_{26}$ - 134
$U_{27}$ - 234

V. Existing Deck $V_1$ - Nailable
$V_2$ - Nonnailable

W. Base Sheet Attachment $W_1$ - Hot Asphalt, Mechanical Attachment
$W_2$ - Hot Asphalt X. Existing System $X_1$ - Coal Tar, BUR
$X_2$ - Asphalt BUR, Gravel Surfaced
$X_3$ - Asphalt BUR, Organic Smooth
$X_4$ - Asphalt BUR, Fiberglass Smooth
$X_5$ - Asphalt BUR, Smooth
$X_6$ - Any existing system; note, choice when offered will not affect path.

FIGURE 1D

FLOWCHART USF PART IV

DECK: Structural Wood Fiber

CONSTRUCTION TYPE: New (Note, NO tear-off over Tectum decks)

DECK: Lightweight Concrete Gypsum

CONSTRUCTION TYPE: New Construction
Tear-Off Construction (NOT ALLOWABLE PATHS)

DECK: Concrete

CONSTRUCTION TYPE: New Construction
Tear-Off Construction

DECK: Concrete

CONSTRUCTION TYPE: New Construction
Tear-Off Construction

DECK: Steel

CONSTRUCTION TYPE: New Construction
Tear-Off Construction

DECK: Steel

CONSTRUCTION: New Construction
Tear-Off Construction

DECK: Steel

CONSTRUCTION TYPE: New Construction
Tear-Off Construction

DECK: Steel

CONSTRUCTION TYPE: New Construction
Tear-Off Construction

DECK: Wood

CONSTRUCTION TYPE: New Construction
Tear-Off Construction

DECK: Wood

CONSTRUCTION TYPE: New Construction
Tear-Off Construction

DECK: Wood

CONSTRUCTION TYPE: New Construction
Tear-Off Construction

DECK: Wood

CONSTRUCTION TYPE: New Construction
Tear-Off Construction

DECK: N/A

CONSTRUCTION TYPE: Recover - without additional insulation

DECK: N/A

CONSTRUCTION TYPE: Recover - without additional insulation

DECK: N/A

CONSTRUCTION TYPE: Recover - with additional insulation

FLOWCHART USE: PART II

INSULATION MASTER PATHS

INSULATION MASTER PATHS (cont.)

INSULATION MASTER PATHS (cont.)

FLOWCHART USE: PART III
PRODUCT SELECTION MASTER PATHS
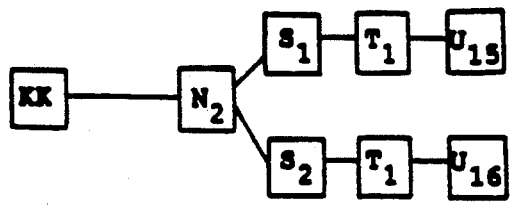
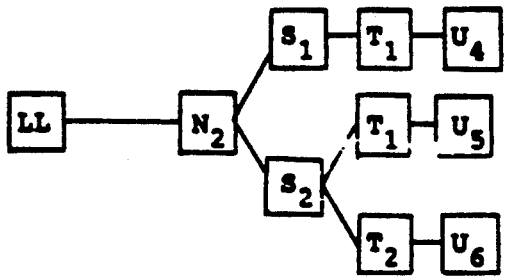
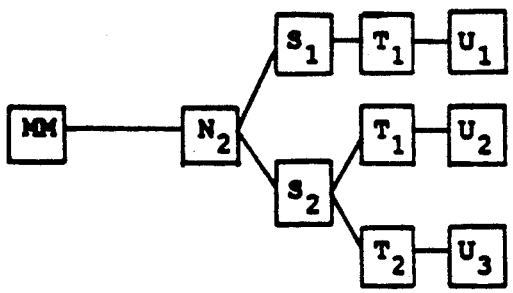
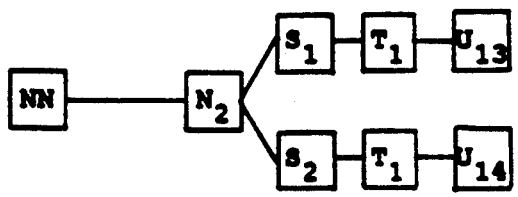
FIGURE 5A PRODUCT SELECTION MASTER PATHS (cont.)
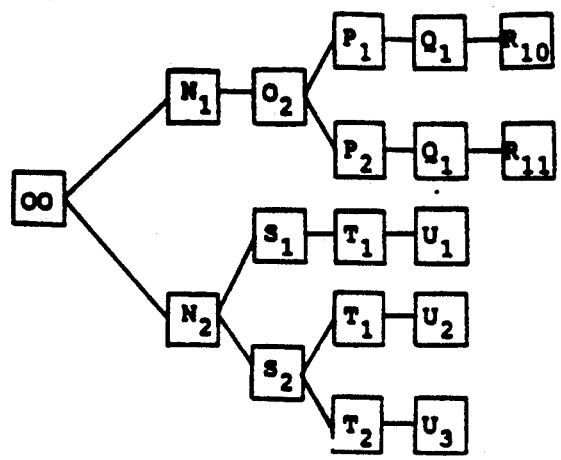
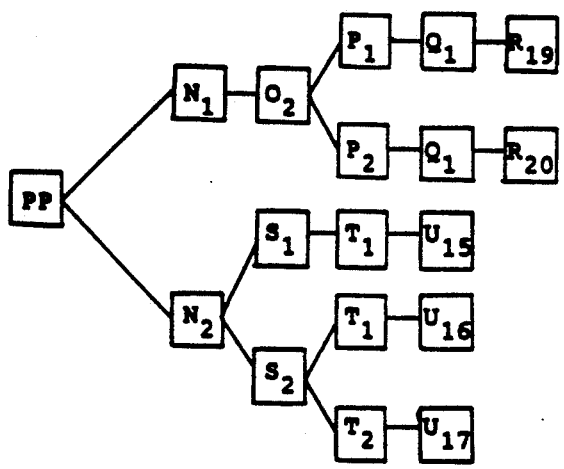
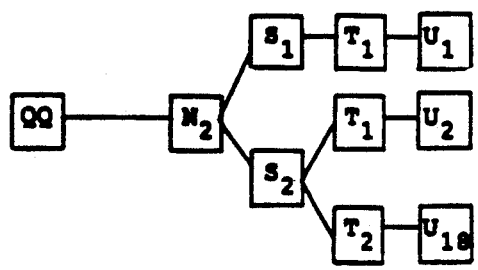
FIGURE 5B PRODUCT SELECTION MASTER PATHS (cont.)
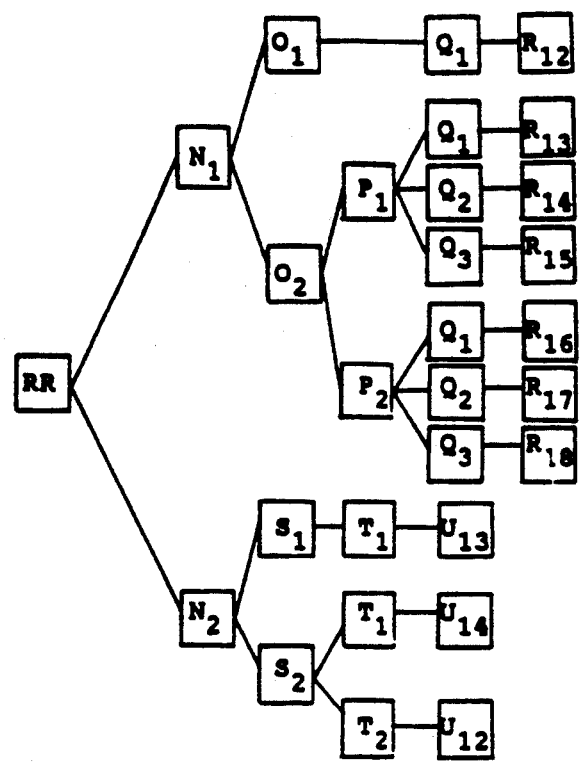
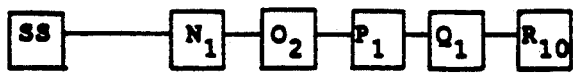
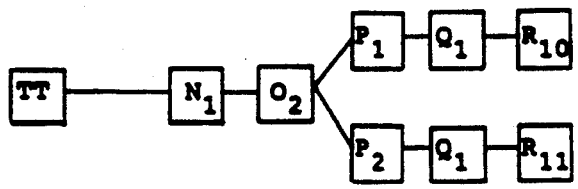
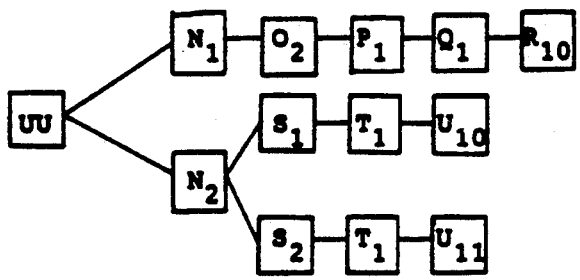
FIGURE 5C

PRODUCT SELECTION MASTER PATHS (cont.)
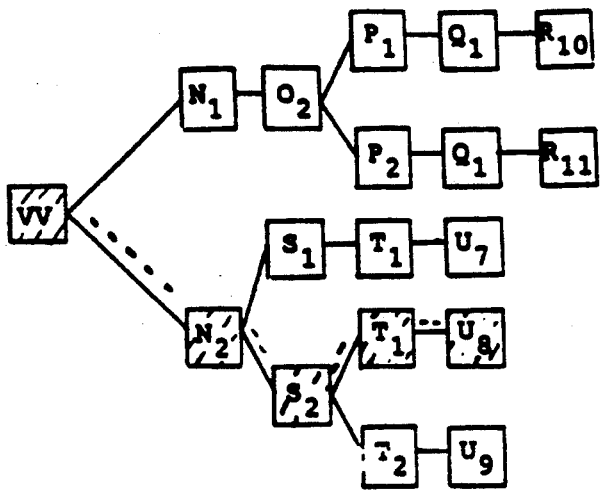
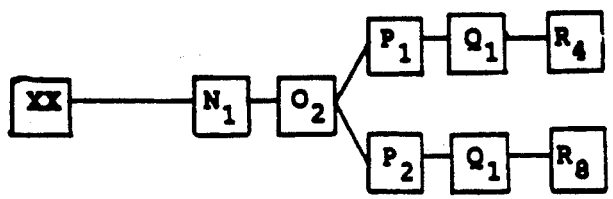
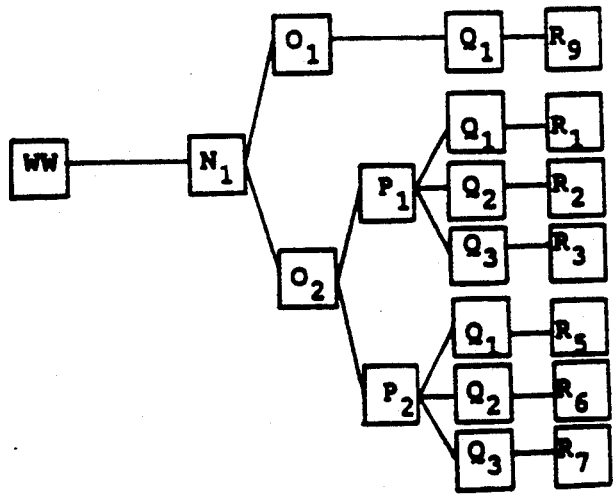
FIGURE 5D

PRODUCT SELECTION MASTER PATHS (cont.)
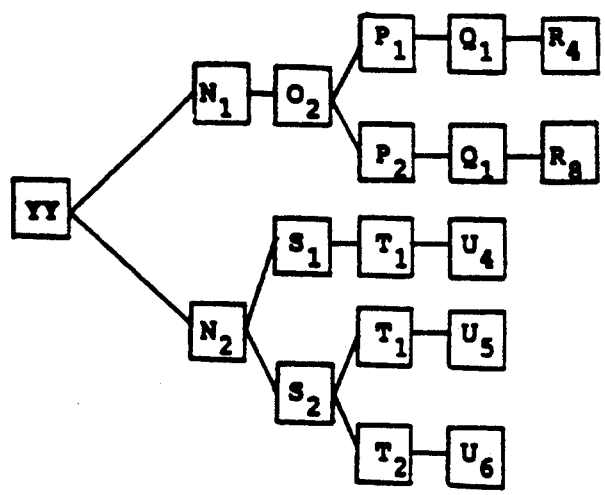
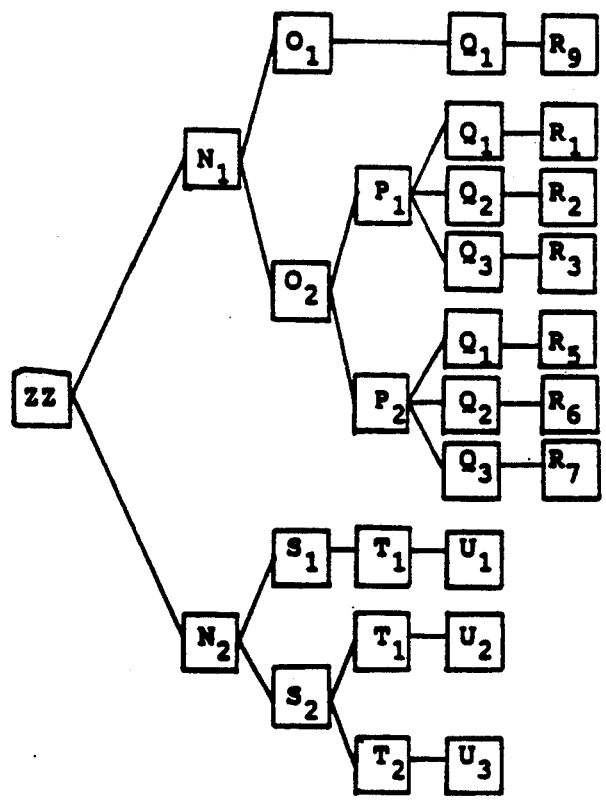
FIGURE 5E

NUMBER SYSTEM & CHOICES IN TAM-CADD FOR SPECMODS

| Number | | Option/Choice | Number | | Option/Choice |
|---|---|---|---|---|---|
| 1 | | Construction Type | 10 | | First Layer |
| | A | Recovery | | A | Perlite |
| | B | New Construction | | B | Woodfiber |
| | C | Tear Off | | C | EPS |
| | | | | D | Phenolic |
| 2 | | Recover Type | | E | Foamglass |
| | A | W/addt'l insulation | | F | Fiberglass |
| | B | W/O insulation | | G | Isocyanurate |
| | | | | H | Composite |
| 3 | | Roof Deck | | | |
| | A | Steel | 11 | | First Layer Attachment |
| | B | Wood | | A | Mechanical |
| | C | Concrete | | B | Hot Asphalt |
| | D | Gypsum | | | |
| | E | Lightweight | 12 | | Second Layer |
| | F | Structural Woodfiber | | A | Perlite |
| | G | Other | | B | Woodfiber |
| | | | | C | EPS |
| 4 | | Warranty Length | | D | Phenolic |
| | A | 5 yrs | | E | Foamglass |
| | B | 10 yrs | | F | Fiberglass |
| | C | 12 yrs | | G | Isocyanurate |
| | D | 15 yrs | | H | Composite |
| | E | 20 yrs | | | |
| | F | None | 13 | | Second Layer Attachment |
| | | | | A | Mechanical |
| 5 | | Roof Slope | | B | Hot Asphalt |
| | A | 1/4 | | | |
| | B | 1/2 | 14 | | Third Layer |
| | C | 3/4 | | A | Perlite |
| | D | 1 | | B | Woodfiber |
| | E | 1 1/2 | | E | Foamglass |
| | F | 3 | | F | Fiberglass |
| 6 | | Gypsum Board | 15 | | Third Layer Attachment |
| | A | No | | B | Hot Asphalt |
| | B | Yes | | | |
| | | | 16 | | Insulation R-Value |
| 7 | | Vapor Retarder | | A | $\geq 5$ |
| | A | No | | B | $< 5$ |
| | B | Yes | | | |
| | | | 17 | | List of 16B choices |
| 8 | | Select Insulation Type | | | |
| | A | Yes | 18 | | List of 16A choices |
| | B | No | | | |
| | C | None required | 19 | | Tapered? |
| | | | | A | Yes |
| 9 | | No. of Layers | | B | No |
| | A | 1 layer | | | |
| | B | 2 layers | | | |
| | C | 3 layers | | | |

FIGURE 6A

| Number | Option/Choice | | Number | Option/Choice | |
|---|---|---|---|---|---|
| 20 | | Which Layer is Tapered | 27 | | Surfacing |
| | A | 1st | | A | None |
| | B | 2nd | | B | Flood & Gravel |
| | C | 3rd | | C | Aluminum |
| | D | Contractors Opt. | | D | Emulsion |
| 21 | | Roofing Type | 28 | | Color |
| | A | Modified System | | A | White |
| | B | BUR | | B | Black |
| | | | | C | Tweed |
| 22 | | Modified Attachment | | D | Terra Cotta |
| | A | Torch | | E | Cedar |
| | B | Hot Asphalt | | F | Wood |
| 23 | | Modified Type | 29 | | BUR Type |
| | A | Premium | | A | Organic |
| | B | 170 | | B | Glass |
| 24 | | 100HW Series | 30 | | Ply Type |
| | A | 101hw | | A | IV |
| | B | 102hw | | B | VI |
| | C | 103hw | | | |
| | D | 105hw | 31 | | 500 Series |
| | F | 107hw | | A | 501 |
| | G | 108hw | | B | 502 |
| | H | 109hw | | C | 503 |
| | I | 111hw | | D | 504 |
| | J | 112hw | | E | 505 |
| | | | | F | 506 |
| 25 | | 100 Series | | G | 512 |
| | A | 101 | | H | 514 |
| | B | 102 | | I | 515 |
| | C | 103 | | J | 516 |
| | D | 105 | | | |
| | F | 107 | 32 | | 600 Series |
| | G | 108 | | A | 601 |
| | H | 109 | | B | 602 |
| | I | 111 | | C | 603 |
| | J | 112 | | D | 604 |
| | | | | E | 605 |
| 26 | | 200 Series | | F | 606 |
| | A | 201 | | G | 612 |
| | B | 202 | | H | 614 |
| | C | 203 | | I | 615 |
| | D | 205 | | J | 616 |
| | E | 204 | | | |
| | F | 207 | 33 | | Surfacing, BUR |
| | I | 211 | | A | Asphalt |
| | J | 212 | | B | Aluminum |
| | | | | C | Emulsion |

FIGURE 6B

| Number | | Option/Choice | Number | Option/Choice |
|---|---|---|---|---|
| | | | D | Flood & Gravel |
| | | | F | Cap Sheet |
| 34 | | 400 Series | | |
| | A | 401 | | |
| | B | 412 | | |
| | C | 402 | | |
| 35 | | Surfacing, Organic BUR | | |
| | A | Flood & Gravel | | |
| 36 | | 100HW Recovers | | |
| | A | 131hw | | |
| | B | 132hw | | |
| | C | 134hw | | |
| | D | 135hw | | |
| 37 | | 100 Recovers | | |
| | A | 131 | | |
| | B | 132 | | |
| | C | 134 | | |
| | D | 135 | | |
| 38 | | 200 Recovers | | |
| | A | 231 | | |
| | B | 232 | | |
| | C | 234 | | |
| | D | 235 | | |

\*\*\*\*\*

| Number | | Option/Choice |
|---|---|---|
| 50 | | Existing System |
| | A | Coal Tar BUR |
| | B | Asphalt BUR Gravel |
| | C | Asphalt BUR Organic Smooth |
| | D | Asphalt BUR Glass Smooth |
| 51 | | Existing Deck |
| | A | Nailable |
| | B | Nonnailable |
| 52 | | Base Sheet Attachment |
| | A | Hot |
| | B | Mechanical |
| 53 | | UL Class A Required? |
| | A | Yes |
| | B | No |

FIGURE 6C

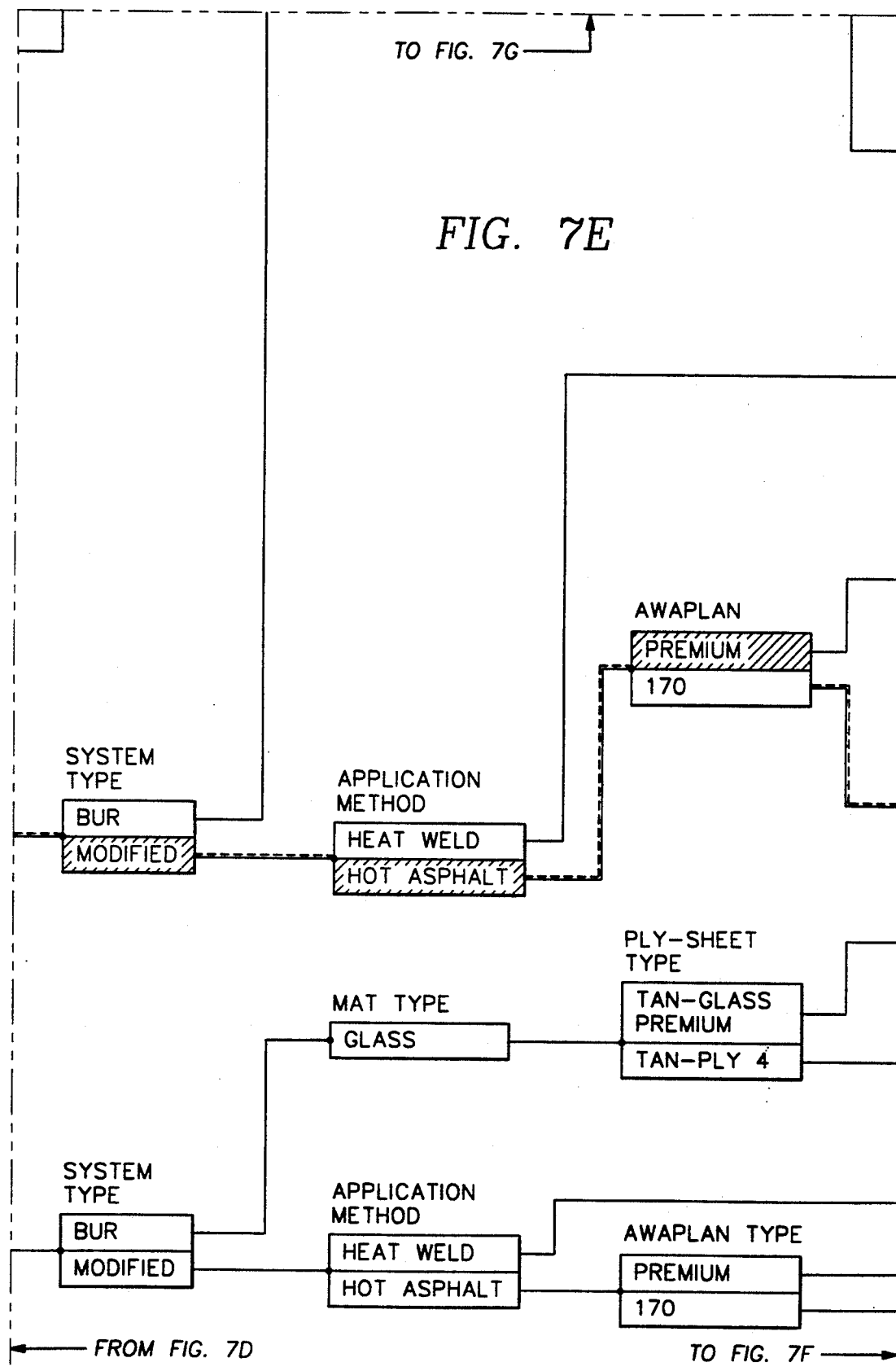

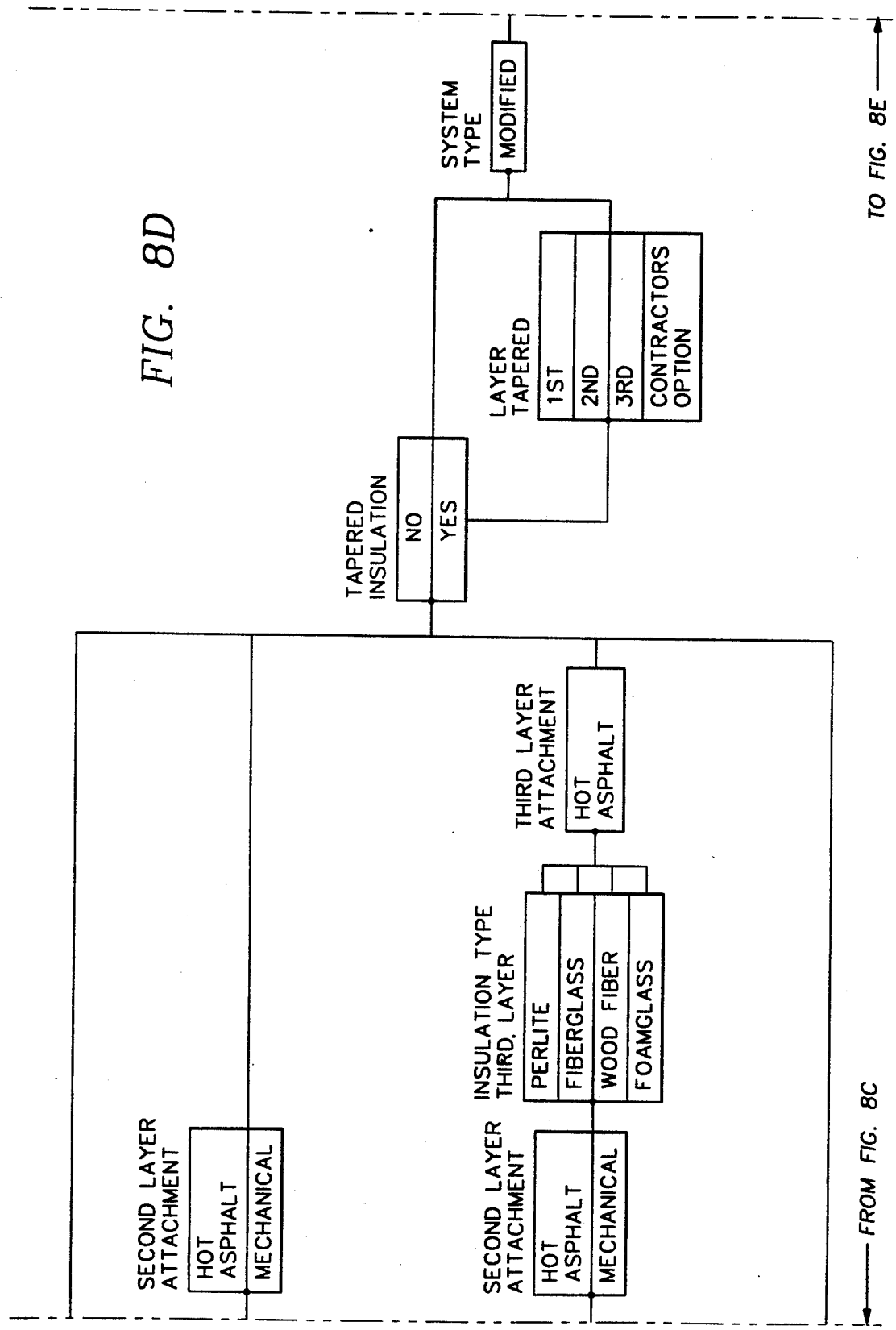

SPECIFICATION SELECTIONS

| | |
|---|---|
| Please Select Your Construction Type | New Construction |
| Please Select Your Roof Deck | Steel |
| Please Select Desired System Guarantee | 15 Year |
| Please Select Your Roof Slope | 1/4" Per Foot |
| Is a Gypsum Board Desired? | Yes |
| Is a Vapor Retarder Desired? | No |
| Would You Like to Select Your Insulation Type? | Yes |
| Please Select the Number of Insulation Layers | 2 Layers |
| Please Select Insulation Layer 1 | EPS |
| Please Select Insulation Attachment for Layer 1 | Hot Asphalt |
| Please Select Your Insulation for Layer 2 | Woodfiber |
| Please Select Insulation Attachment for Layer 2 | Hot Asphalt |
| Do You Want Tapered Insulation? | No |
| Please Select the Desired System Type | Awaplan System |
| Please Select Attachment | Hot Asphalt |
| Please Select Type | Premium |
| Please Select Applicable Spec | 102 |
| Please Select Surfacing | None |
| Please Select Color | White |

FIGURE 9A

SPECMOD DIRECTIONS

Delete 1.02.C

Delete 2.12.C, 3.03 (All options), 3.04 (Wood), 3.05 (Wood, 3.06A (Last "A" Option for all 3.06 layer options)

Insert "15" into 1.10.A; delete 1.10.B, 2.08.D, & 2.08.E

Delete 3.02.F, 3.07 (For >3/4 &<3, 3.08 (For >3/4 & <3

Delete 3.05 (Wood & Metal W/O Sheathing), 3.06.E (for all 3.06 layer options), 3.06.A (Last "A" option for all 3.06 layer options)
Note: Refer to User's Guide, Section on Graphic Modification.

Delete 1.01.B, 2.03, 3.05 (All), 3.06.A (Second "A" option for all 3.06 layer options IF WOOD OR STRUCTURAL WOODFIBER DECK)

Delete 2.07.A.4; insert Minimum Thickness if required into 2.07.A.5 or delete

Delete 2.07.D, 3.06 (One & Three Layers)

Delete 2.07.B.1 - 5, 2.07.B.7, 2.07.B.8; insert Minimum Thickness (if required) into 2.07.B.6.b or delete Delete 3.06.A (first option for 1 layer application, first & third option for 2 & 3 layer applications)

Delete 2.07.C.2-8; insert Minimum Thickness (if required) into 2.07.C.1.b or delete Delete 3.06.A (third option for 2 & 3 layer applications)

Delete 1.04.A, 3.06.F

\*

\*

\*

\*

Delete 1.04.D, 2.09, 3.10.C, 3.11

MACHINE-AIDED METHOD FOR THE SELECTION OF ROOFING SYSTEMS AND THE GENERATION OF SPECIFICATIONS THEREOF

The Microfiche Appendices I & II included 19 Microfiche, 1130 frames.

BACKGROUND OF THE INVENTION

The present invention relates to a machine-aided method for selecting commercial roofing systems based on data representative of the design features of a building to be roofed. The invention also relates to the machine generation of roofing specifications which correspond to both the selected roofing system and the user provided design features.

Roofing Design Requirement Selection

For a commercial roofing system to perform satisfactorily, the design features of the building to be roofed must match those of the selected roofing system. Such design features include information representative of desired roofing requirements such as: the desired roof slope, the desired length of "roof guarantee", and the desired number of insulation layers. The design features also include certain user selected attributes such as roof color, and tapered insulation. In all, the design features represent the set of design requirements and desired attributes that a selected roofing system must contain and fulfil.

In the past, the selection of roofing systems was accomplished through the use of published roofing system manuals. These manuals contained voluminous amounts of information concerning each roofing specification available to the user. Selection of the roofing system was made by the user referring to various sections of the manual in an attempt to discover a system capable of providing the desired design features. There was no systematic method for the use of these manuals.

The roofing selection manuals allowed the user to prioritize the desired roofing design features in any order desired. This often resulted in the user making several decisions, deciding on several design features, only to discover that the selected features were incompatible and could not be combined in a single roofing specification. The results of selecting an incompatible system could vary from added delay in the reelection of an appropriate system to the installation of an unacceptable roofing system. Thus, the selection of roofing systems in the past has been tedious at best and improper at worst.

Generation of Specification for Selected Roofing Features

In addition to making the roofing system selection, the design professional is also faced with the task of generating system specifications corresponding to the roofing system selected.

In the past, these specifications were generated through the use of the information contained in the roofing system manual. The user of the manual, as in the case of system selection, was referred to various sections in the manual. This process was prone to error as exceptions to the general requirements were often neglected, and various specification details ignored.

Disadvantages associated with the manual method of selection and specification generation are the necessary amount of time that must be expended in the selection of a system and the generation of the corresponding specification. Also, there exist no non-user limitations in this method to prevent the design professional from selecting an improper option. Further, in the event the user has selected an improper system, the manual method provides no means to inform the user of their improper choice.

SUMMARY OF THE INVENTION

The present invention addresses the above-noted and other disadvantages by providing a useful machine-aided method for the selection of appropriate roofing systems. Further, the present invention also provides a method and apparatus for producing detailed machine-generated specifications customized to the selected roofing system.

In a broad aspect, a system in accordance with the present invention comprises a machine-operated method of receiving user data representing the desired design features of a roofing system to be constructed, and selecting on the basis of this data an appropriate proposed roofing system.

The system receives the data and compares it with data corresponding to known roofing systems. The system then informs the user of a proposed roofing system or systems that match the user's desires. If several systems are found acceptable, the user may select any one of the appropriate alternatives.

Another aspect of the invention relates to machine generation of specifications corresponding to the selected roofing system. The specification corresponding to the selected roofing system is obtained by comparing data entered by the user with data corresponding to several specification parameters.

Once a specific roofing system is selected by the user, the invention then selects a master roofing specification corresponding to this system. The master roofing specification is then modified to reflect the user data representing desired design features.

According to an expert-system form of the invention, the design professional is systematically questioned as to the desired design features of the roofing system. The data received from these questions are utilized to generate additional questions and to narrow the number of roofing systems available for the application. This method of questioning prevents the selection of improper roofing systems and reduces the time required in system selection.

Critical to this method of questioning is the order in which the questions are asked, as well as the nature of the questions themselves. The specific order of questioning employed in the present invention is illustrated in several decision-trees. This organization facilitates non-repetition of questions and allows for the formulation of logical paths to reach the desired system specification.

In this decision-tree embodiment of the invention, the roofing specification is generated after the selection of the appropriate roofing system. This is done by associated each roofing system with a master specification.

Once the system is selected, so too is a master specification. The invention modifies the master specification in accordance with the data received from the design professional (user). The data received from the user are compared with data corresponding to specification modification parameters. If a match is found, the master specification is modified according to the specific modification parameter.

In one embodiment, the method of the invention is utilized through the proper programming of a digital computer. This embodiment allows for the rapid selection of the appropriate roofing system and the generation of the associated specifications.

Accordingly, it is a general advantage of the present invention that it provides an improved method for the selection of appropriate roofing systems. It is a further advantage of this invention to provide for the rapid generation of a specific specification associated with the selected roofing system.

Other advantages of the invention will become apparent from the following detailed description made in accompanying drawings and appendices.

BRIEF DESCRIPTION OF THE DRAWINGS AND APPENDIXES

FIGS. 1A-1D illustrate the organization structure of the option group choices available to the user of the invention.

FIGS. 5A-5E illustrate the product selection logic paths.

FIGS. 6A-6C illustrate the customizing labels utilized in the generation of the roofing specification.

FIGS. 7A-7H illustrate the possible logic paths for both new and tear-off construction.

FIGS. 8A-8E illustrate the possible logic paths for recover construction.

Figure 2A:
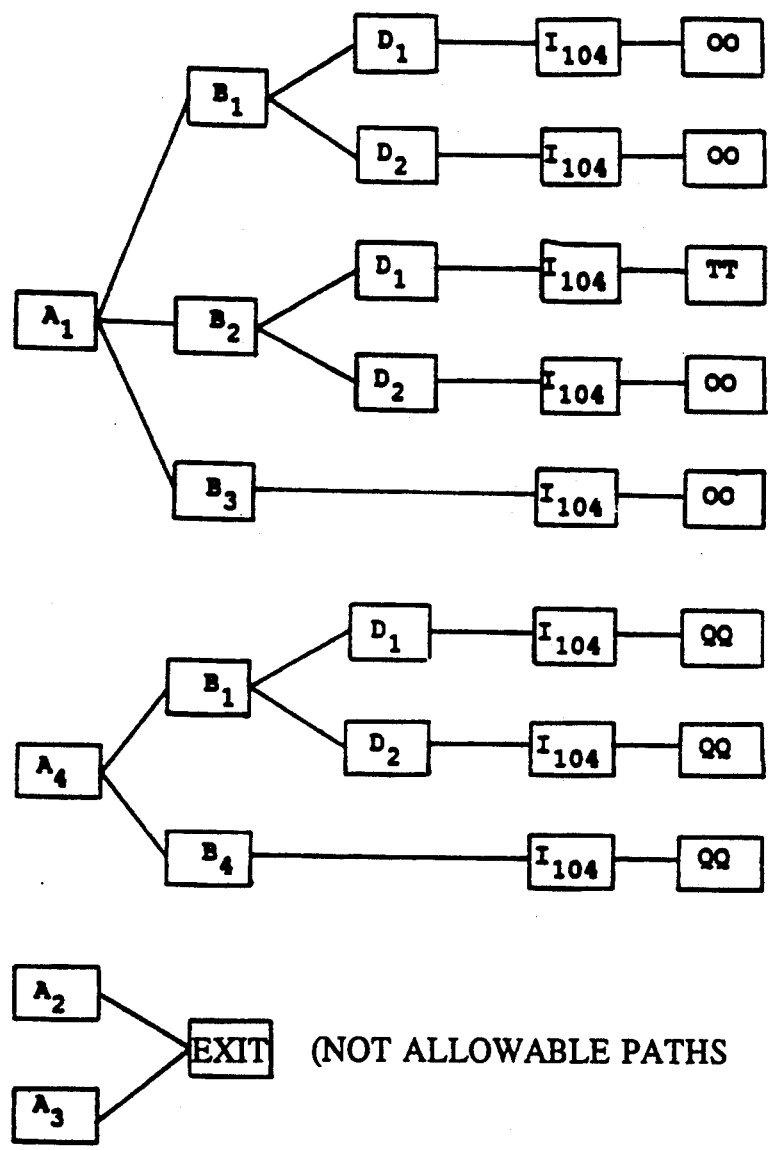
FIGS. 2A-2L illustrate the master logic paths for both new construction and tear-off construction.
Figure 2B:
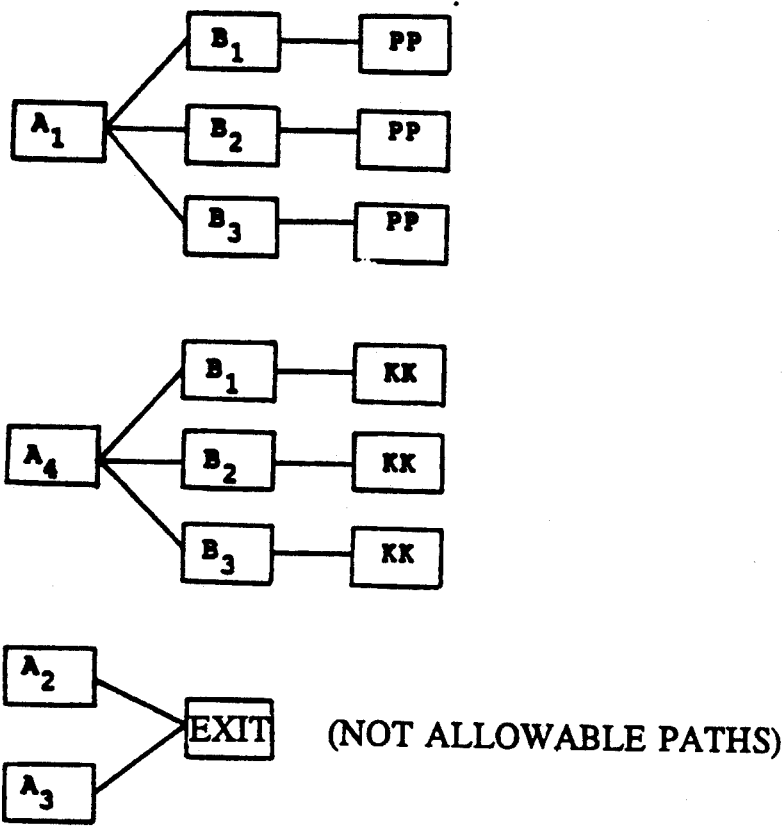
Figure 2C:
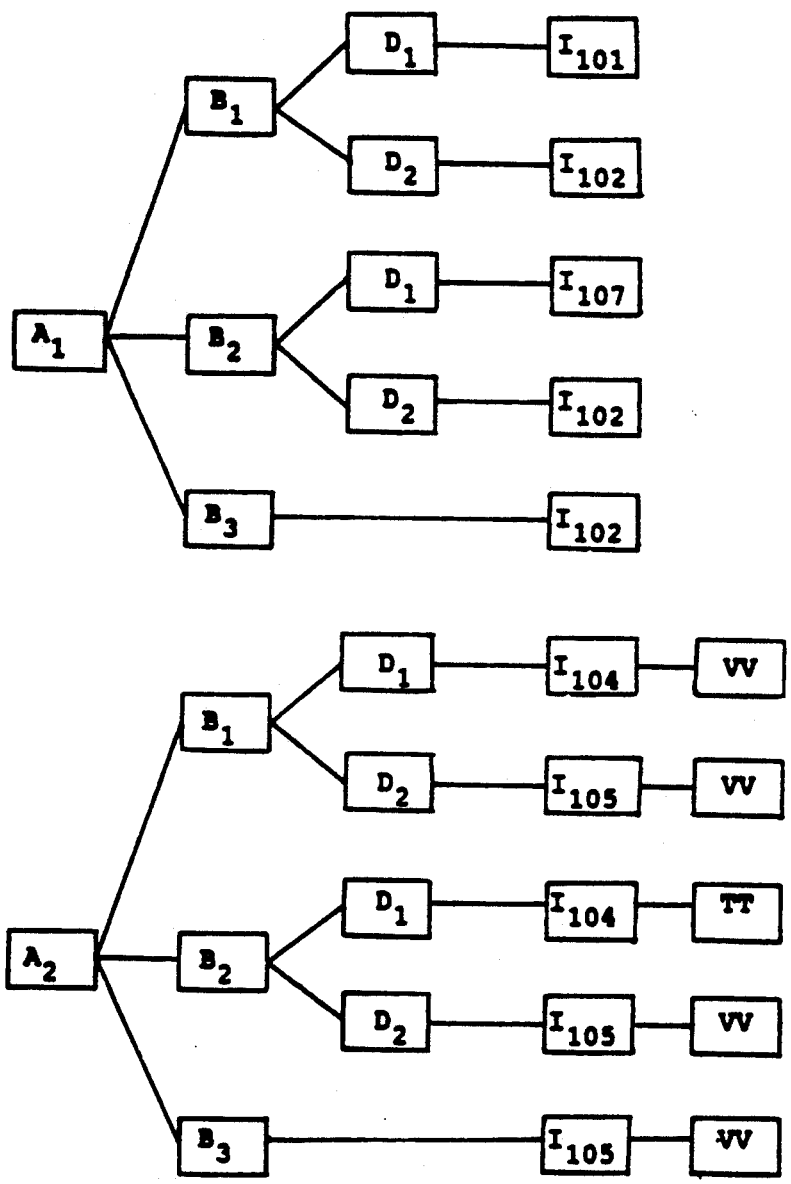
Figure 2D:
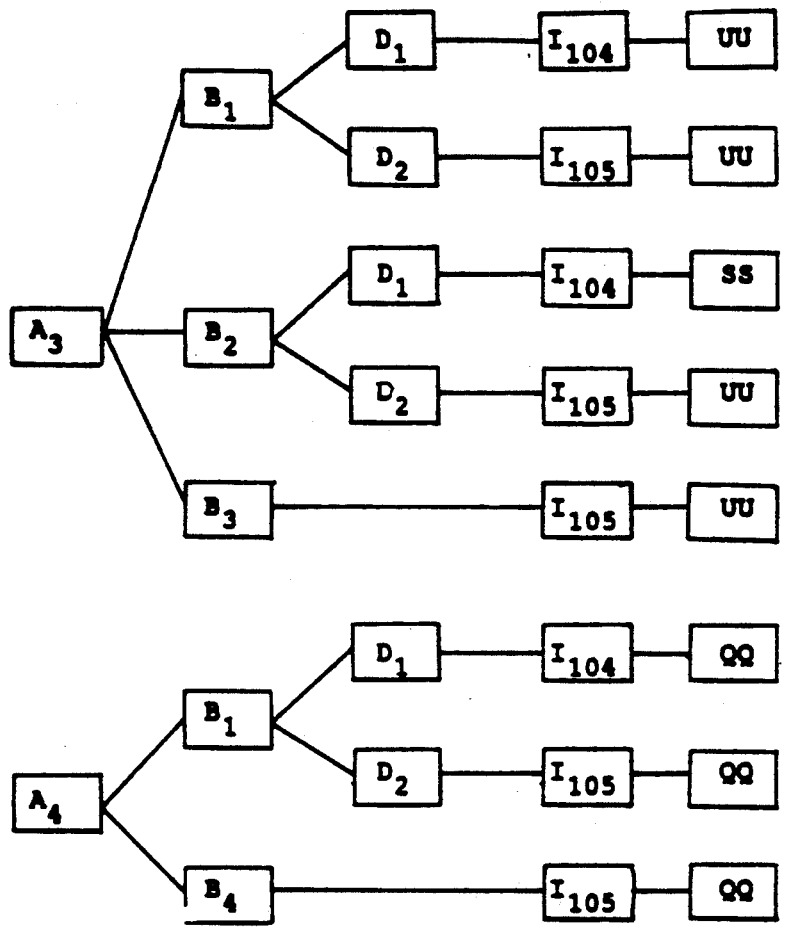
Figure 2E:
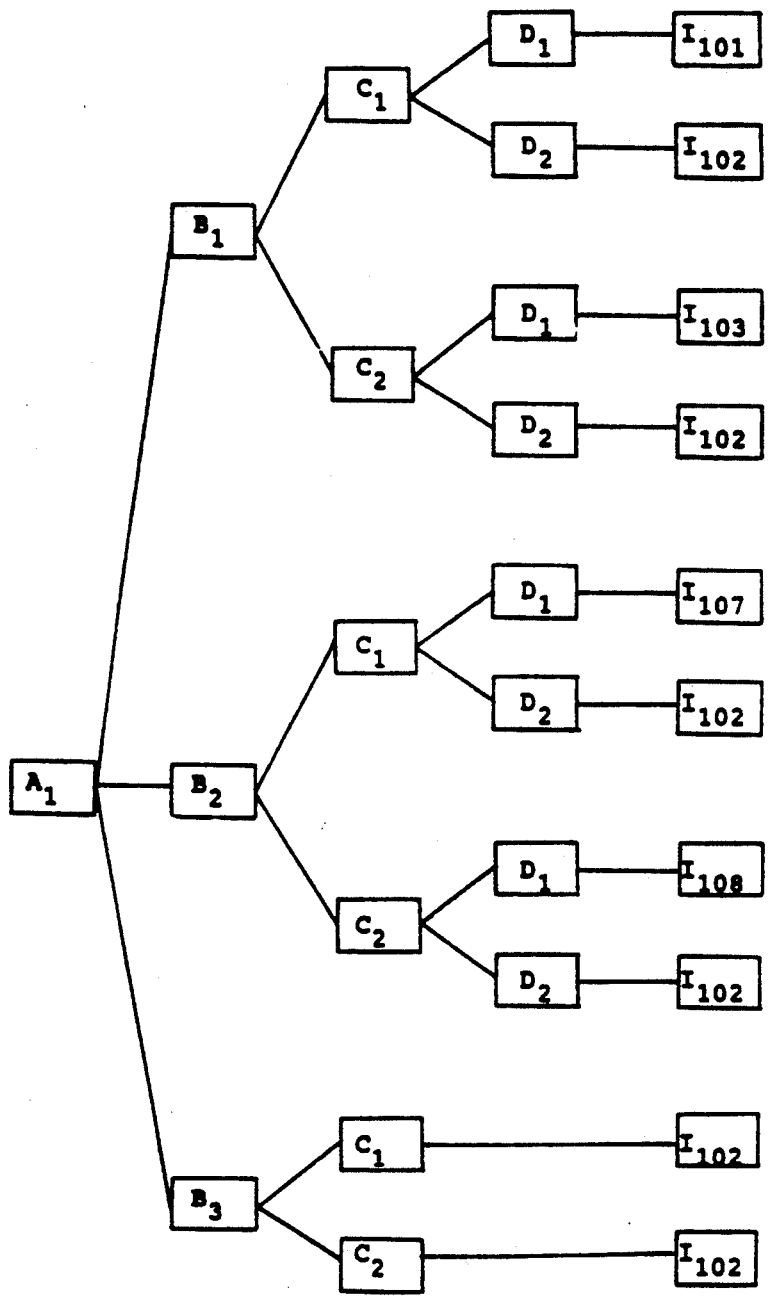

FIGS. 9A-9B respectively illustrate example user data and example specification modifications.

Appendix I (microfiche) contains a listing of the Master Specifications utilized in one embodiment of the present invention.

Appendix II (microfiche) contains a listing of the SpecMods utilized in one embodiment of the present invention.

Appendix III contains an example roofing specification generated by one embodiment of the present invention.

DESCRIPTION OF SPECIFIC EMBODIMENTS

FIG. 1A-1D illustrate labels employed to represent various options and option groups utilized by the preset invention. The option labels are used to aid in the understanding of the logical path diagrams, as well as for ease of organization. Reference to the various option choices will be made by the letter designations used in FIG. 1.

Categorization of Options

As can be seen in FIG. 1A, in the present invention the universe of available option choices has been divided into various "option categories." These option categories are further divided into "option groups."

Figure 1C:
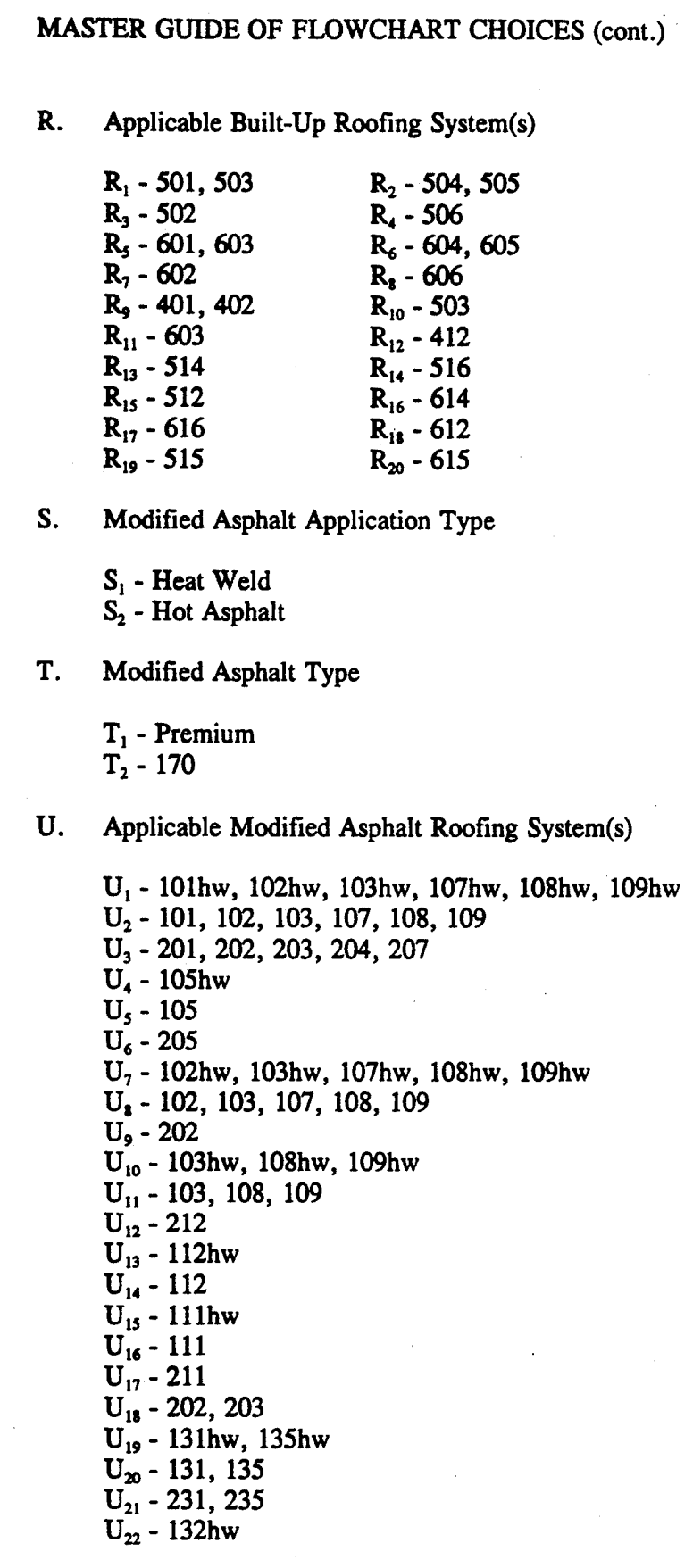

Each option category represents a select group of choices which affect the final system selection and specification. Examples of option categories include: option category A—guarantee; B—slope; C—gypsum board; etc. FIG. 1 illustrates option categories A (Guarantee) through I (1st Layer Attachment). FIGS 1B-1D illustrate option categories J; (2nd Layer of Insulation), through X; (existing system).

Each option category comprises one or more option groups. The option groups are made up of one or more specific choices available to the user. While information indicating the specific choice is required for specification generation, for the purposes of system selection various choices may be grouped together and represented by a single label.

For example, in option category A—Guarantee, there are four option groups. Group A1 represents a guarantee of either five years, ten years or zero years, (none). Group A2 corresponds to a fifteen year guarantee, and groups A3 and A4 represent a twenty and a twelve year guarantee respectively. While the specific duration of the guarantee will be utilized in the generation of the final specification, the roofing system possibilities available for a five year, ten year or no year guarantee are identical. For this reason these choices are combined in a single option group.

Function of Option Groups

Option groups are employed for two basic purposes. The first is to aid the invention in selecting the proper logic path for system selection. The second purpose is to allow the invention to restrict the number of choices available to the user.

Several option groups are important in that they are primarily used to guide the user to the correct option path. For example, when the user is queried as to the necessity of a vapor retarder, the option category D, Vapor Retarder, is used. The user's selection of option group D1, yes or D2, no, will allow the invention to select the proper logic path according to the users choice. In this manner the option groups can be used to guide the user to the selection and specification generation of the proper roofing system.

The option categories can also be used to restrict the user to a limited number of choices. By requiring a selection from a specific option group, the system of the invention may restrict the user to a specific choice, or group of choices. This prevents the user from selection options that are incompatible or improper in light of the choices previously made.

For example, only the Premium asphalt type can be used if Heat Weld application is selected. Thus if the user selected option group S1—Heat Weld from option category S, Modified Asphalt Application Type, the user would be allowed to select only from option group T1. The invention therefore prevents the selection of asphalt type T2—170 which would be improper for a heat weld application. In this example the user was restricted to a single option but in different cases the user could be limited to an option group containing more than one choice.

Since the option groups may be utilized to limit the acceptable number of choices, it is possible that a specific option choice may be found in more that one option group. In option category J, 2nd Layer of Insulation, the option choice Perlite can be found in all three option groups J1, J2 and J3. However, each group contains different elements.

For example, while option groups J1 and J3 both allow the selection of Perlite, Fiberglass, Woodfiber, Foamglass and Composite, option group J1 also allows the additional choice of Isocyamurate. Thus, by providing the user with a particular option group, the invention can broaden or restrict the number of choices available for user selection.

The option categories and option groups represented in FIG. 1A-1D do not represent all the choices available to the user. These categories and groups contain only the choices which affect the selection of a particular roofing system. Other choices, which do not affect system selection, affect the final specification and will be later discussed.

Master Logic Paths

FIGS. 2A-2L and 3A-3C may be explained and understood in light of FIGS. 1A-1D. FIGS. 2A-2L and 3A-3C represent the various "master logic paths" available to the user. These paths indicate the sequence of questioning and the restriction or expansion of options utilized in the present invention.

Figure 2F:
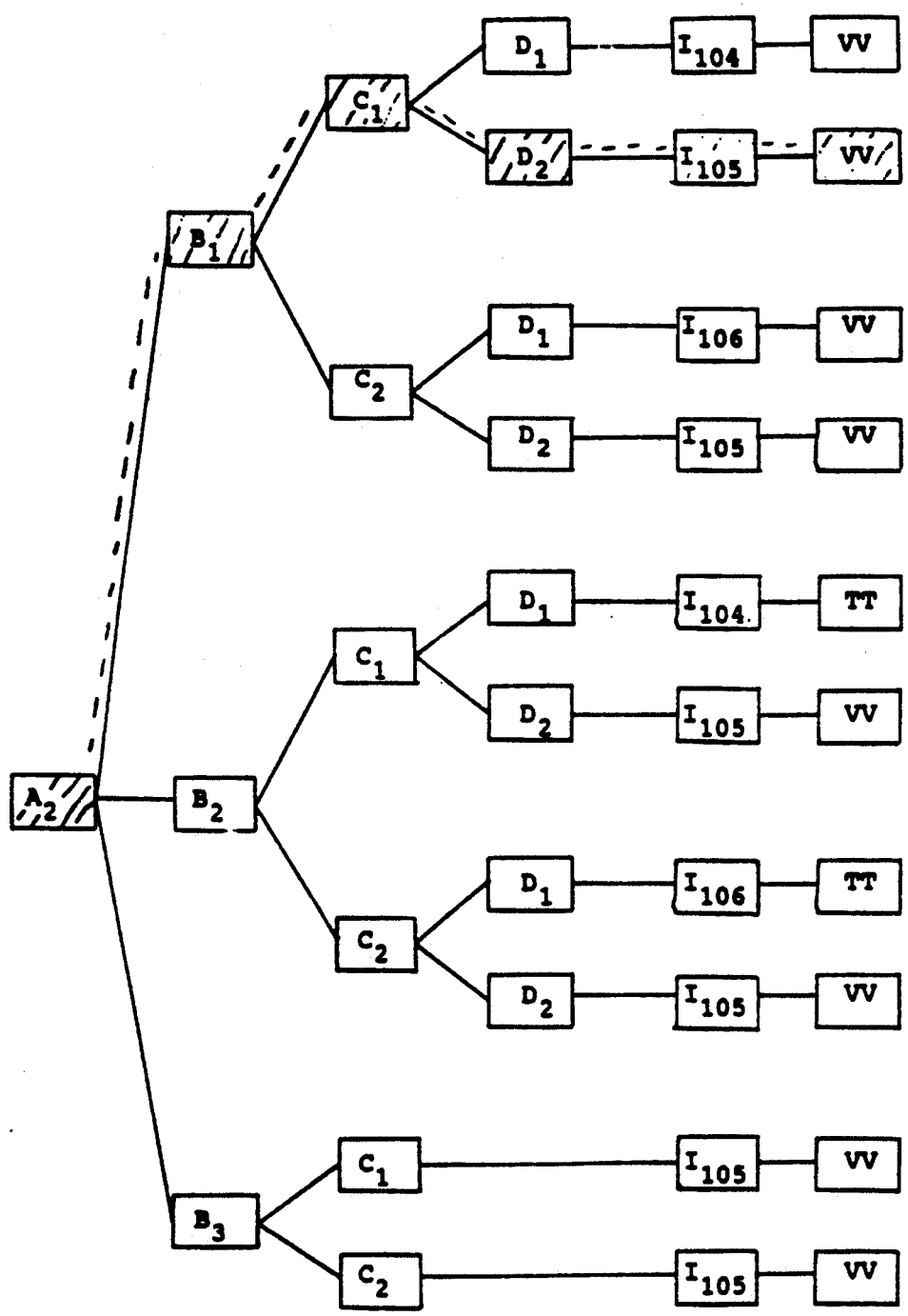
Figure 2G:
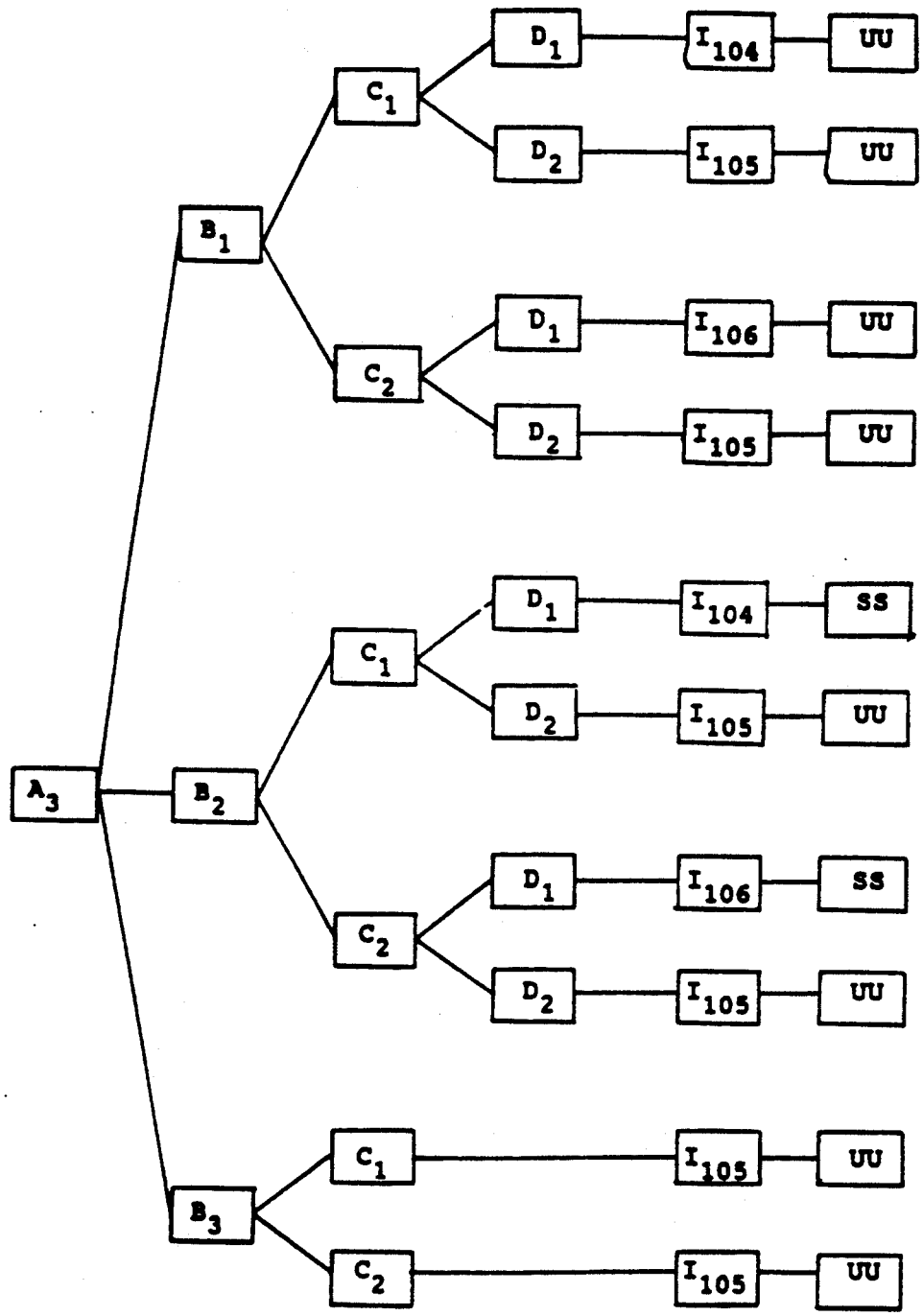
Figure 2H:
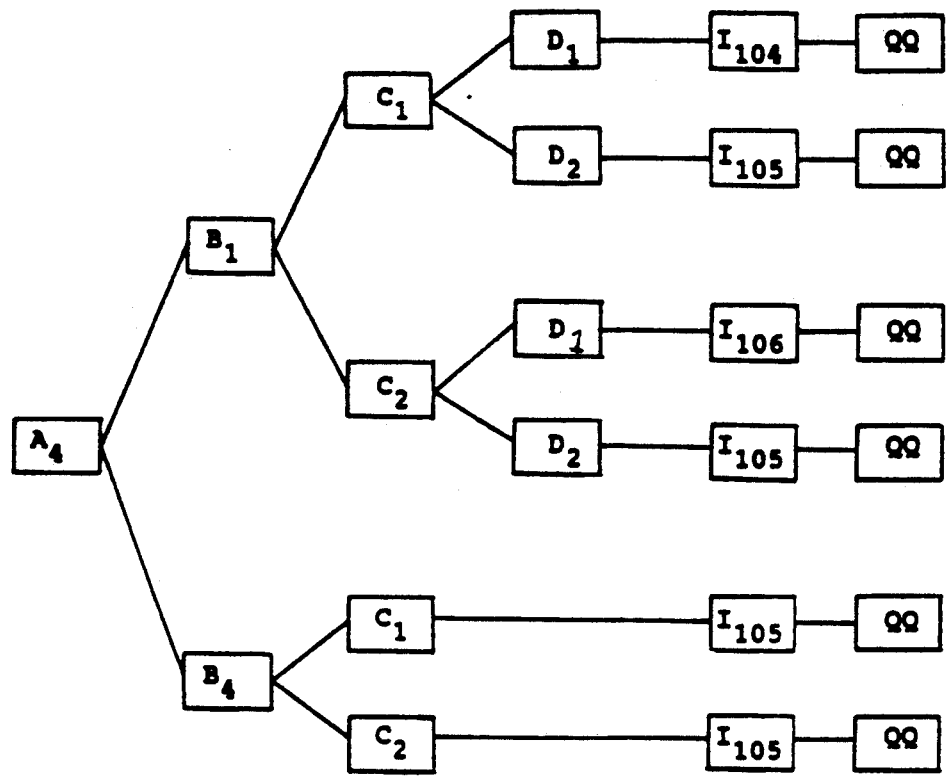
Figure 2I:
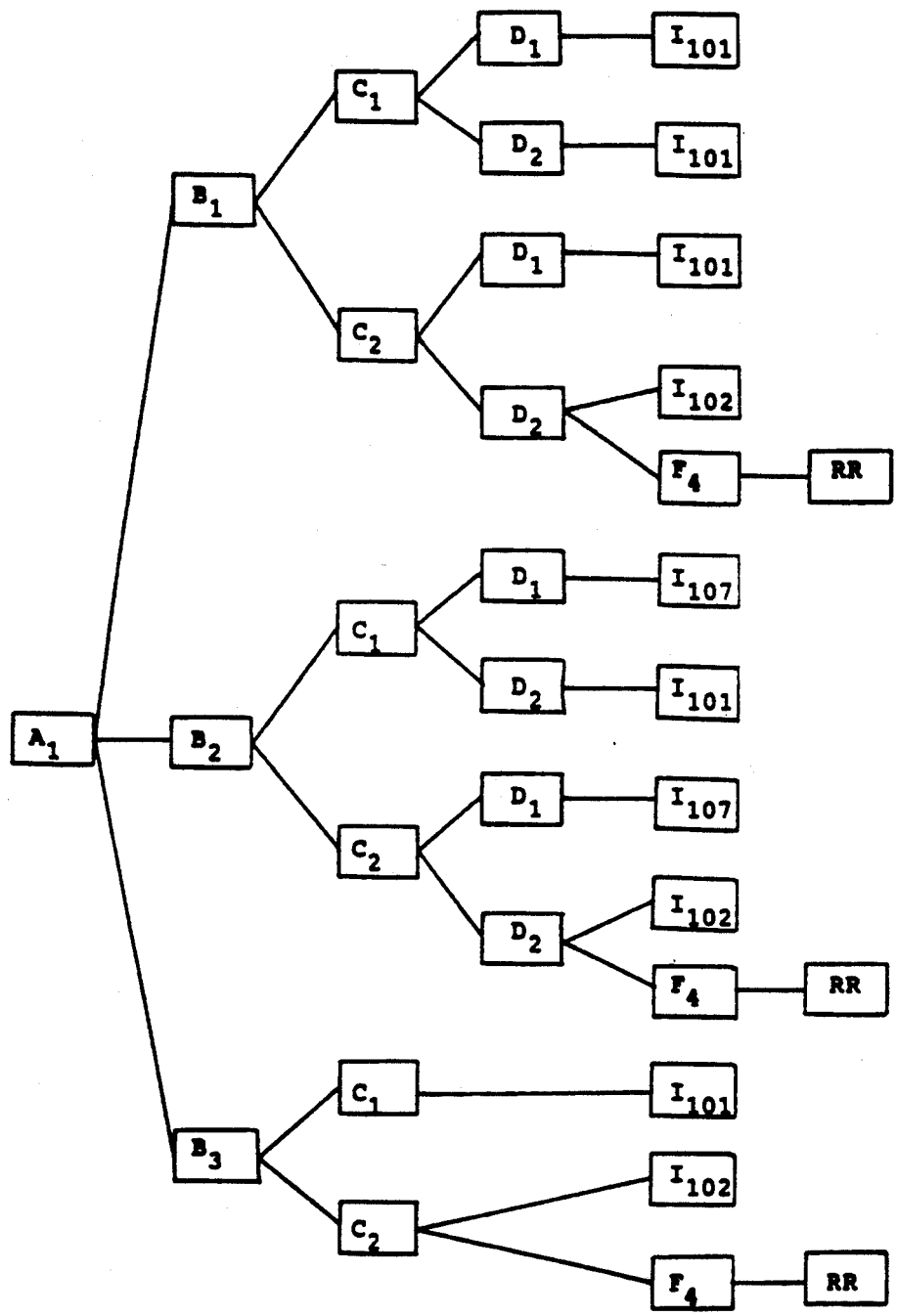
Figure 2J:
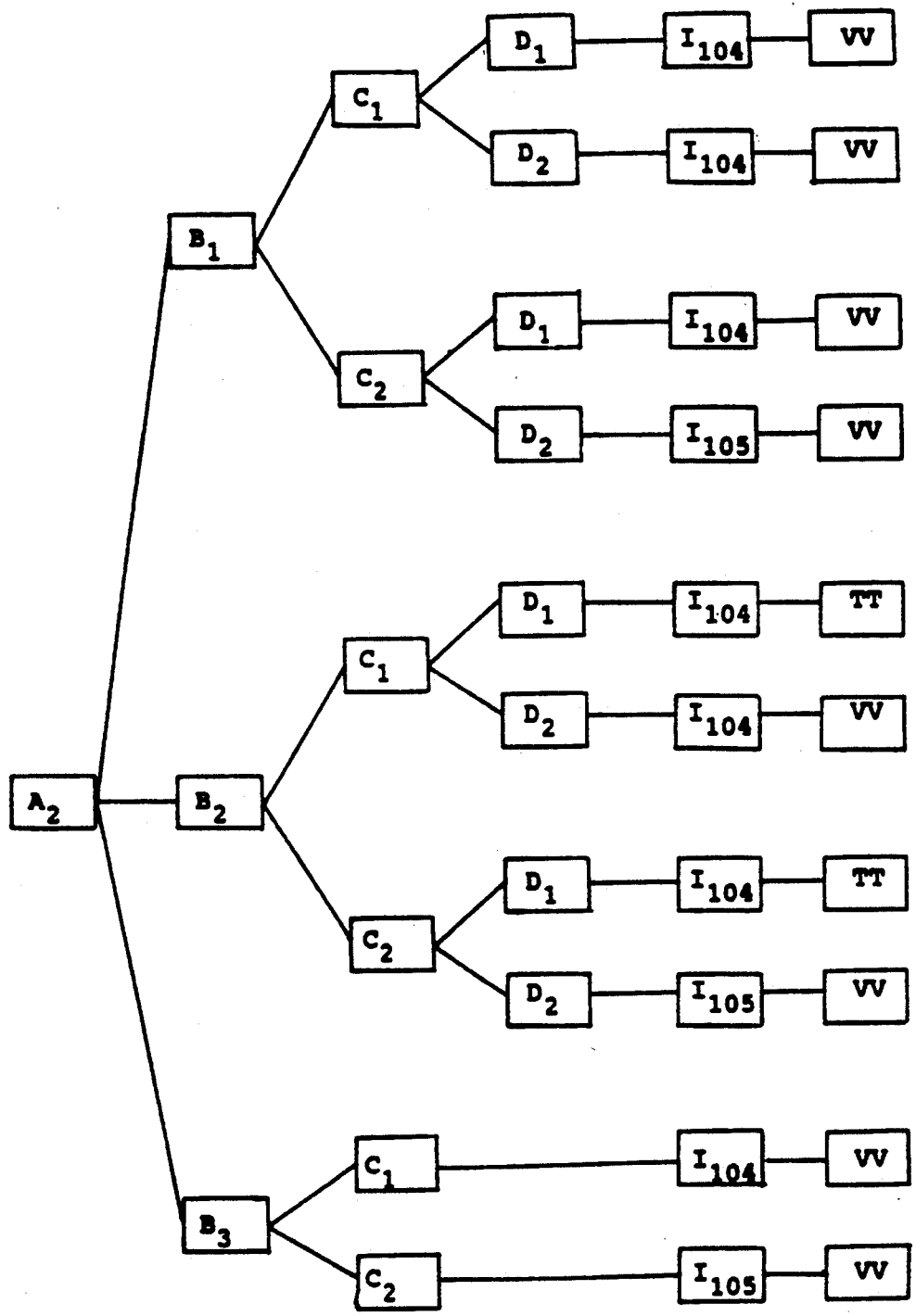
Figure 2K:
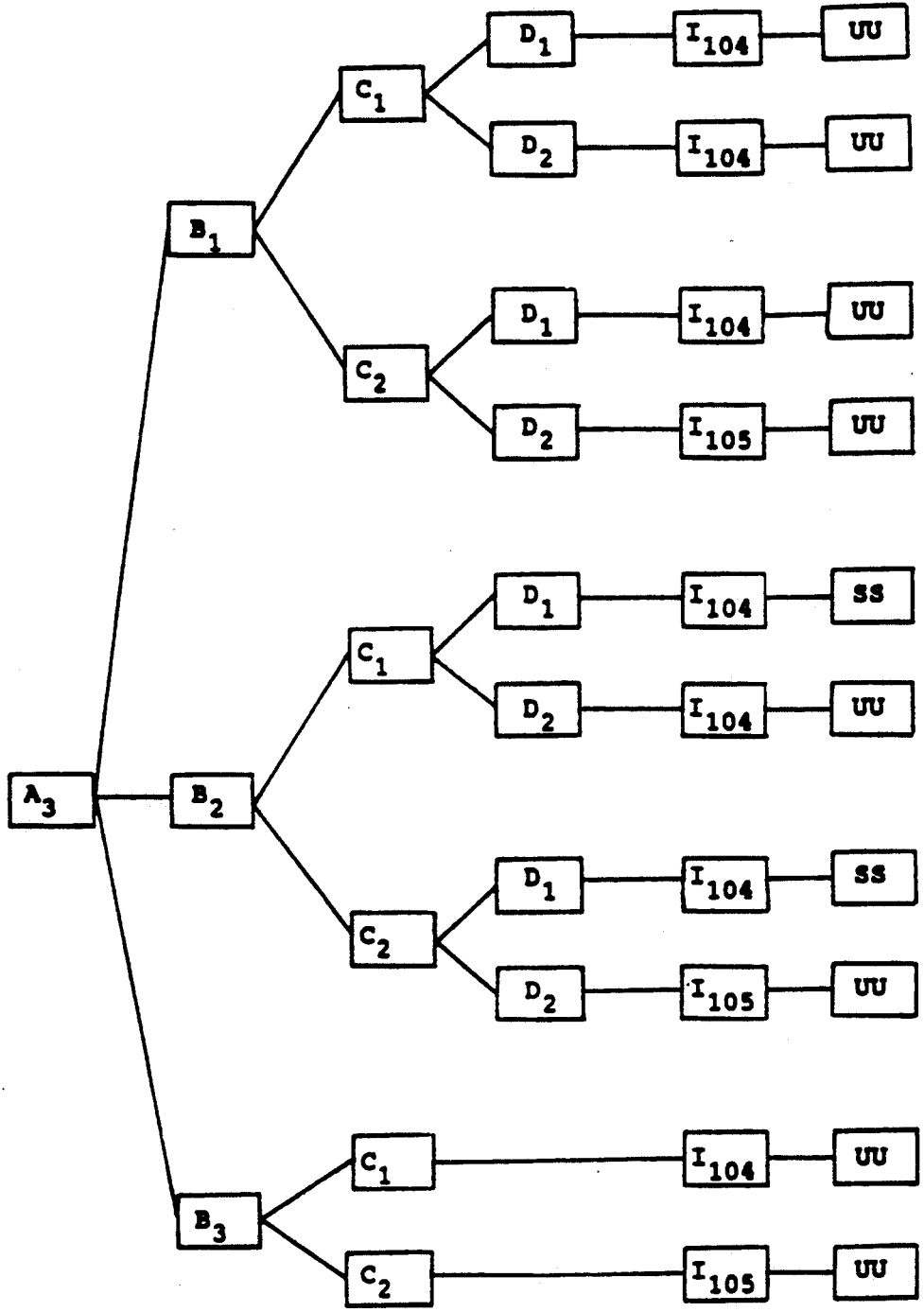
Figure 2L:
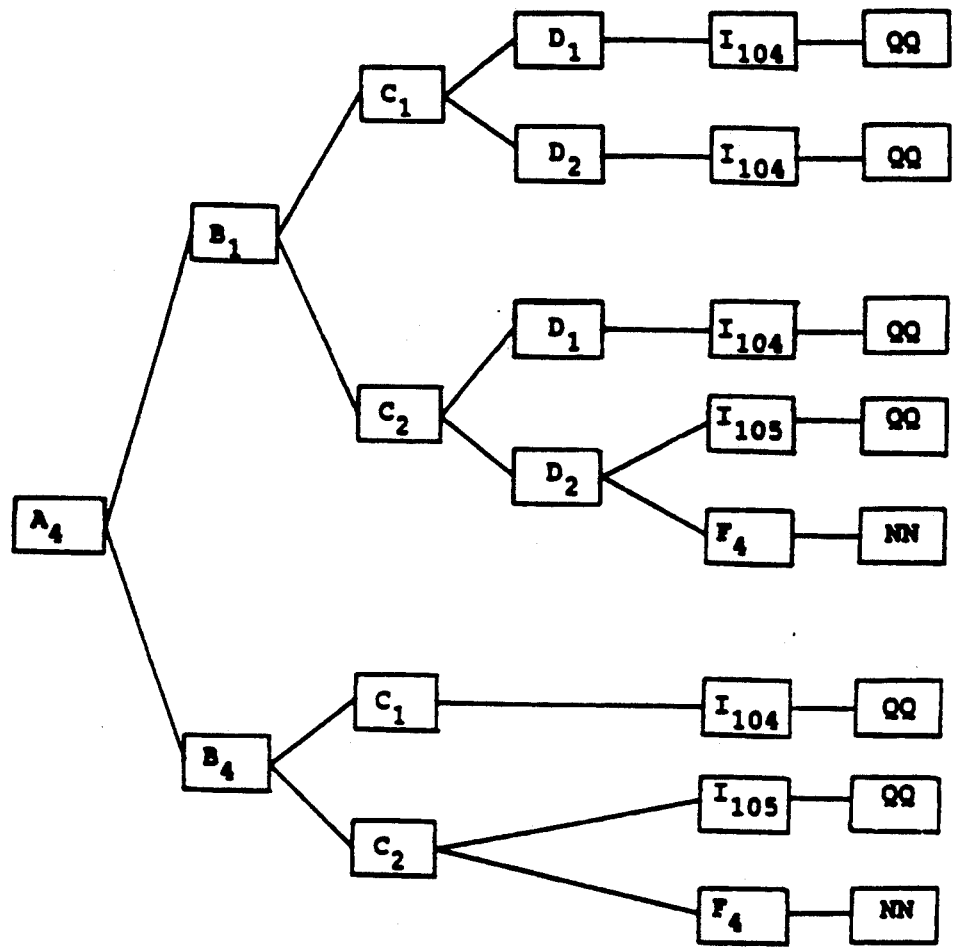
Figure 3A:
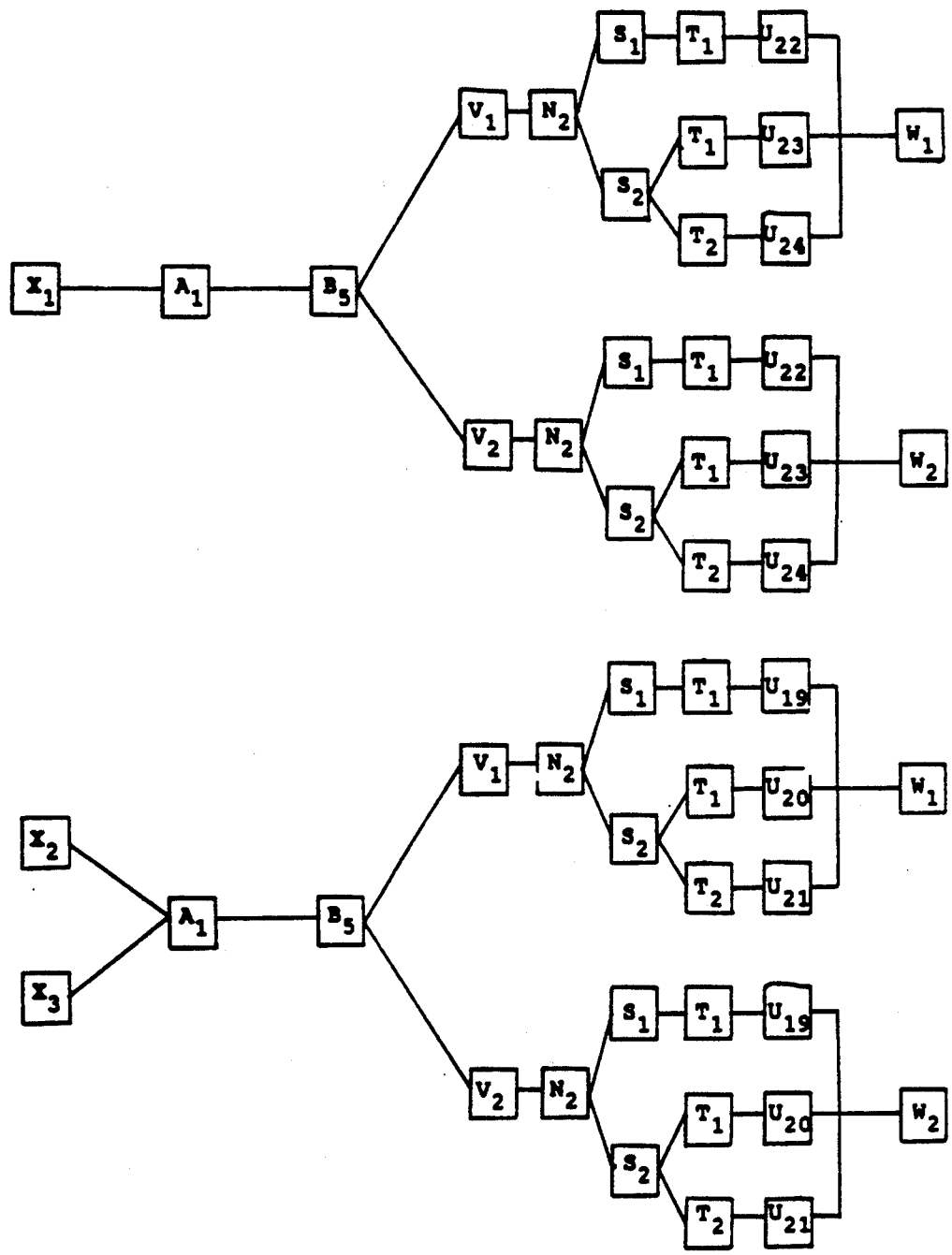
FIGS. 3A-3C illustrate the master logic paths for recover construction.
Figure 3B:
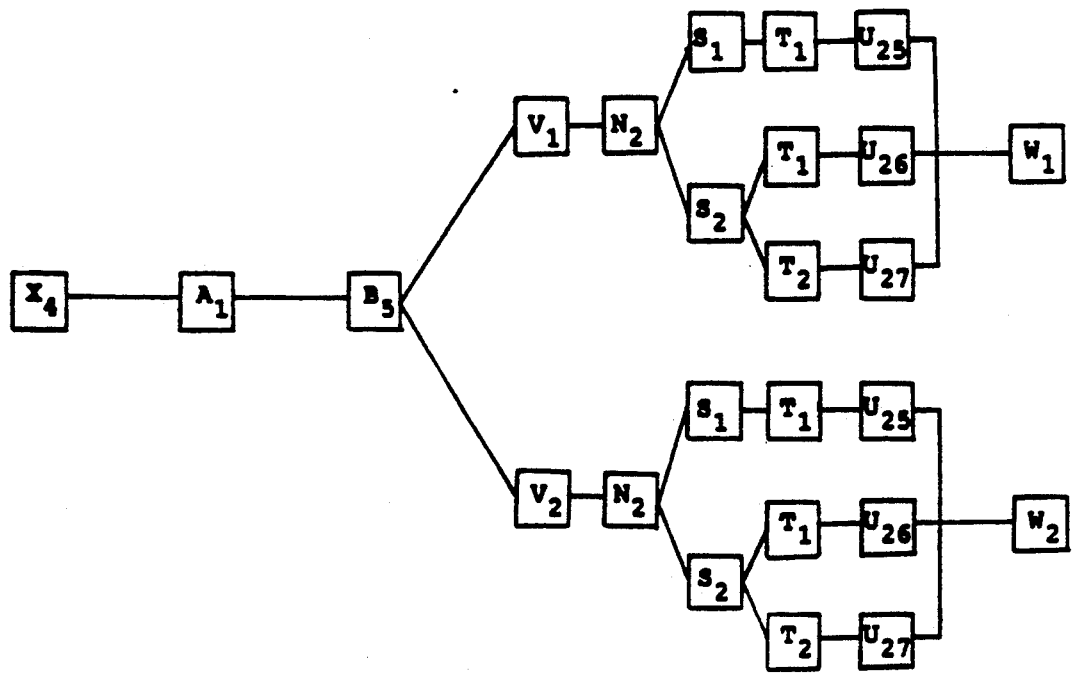
Figure 3C:
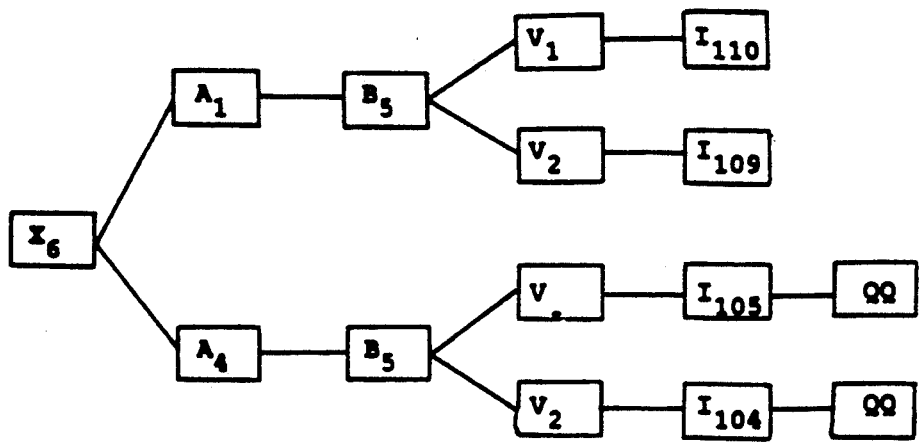

Specifically, FIGS. 2A-2L illustrate master logic paths for both Tear-off and New construction, while FIGS. 3A-3C reveal master logic paths followed for Recover type construction.

The master logic paths are used by the system of the present invention as follows. The user first selects a construction type; either new, tear-off, or recover. If either new construction or tear-off is selected, the logic paths illustrated in FIGS. 2A-2L will be selected; if recover is selected, the logic paths selected will be the ones illustrated in FIGS. 3A-3C.

Once the broad category is selected, the specific master logic paths are chosen. If new construction or recover is selected, the user will be requested to input data representative of the deck type. On the basis of this data, the system of the present invention will select the appropriate group of master logic paths.

For example, if new construction is selected, and the user indicates that the deck is structural wood fiber, the paths illustrated in FIG. 2A will be selected. If the user selected new construction and a concrete deck, the master logic paths illustrated in FIGS. 2C and 2D will be selected.

In the same manner, the system of the invention selects master logic paths for recover operations. In recover, the user is asked to input data indicating whether additional insulation is to be utilized. If there is to be additional insulation, the master logic paths in FIG. 3A and 3B are selected; no additional insulation results in the selection of the paths in FIG. 3C.

Both the recover and new/tear-off sets of logic paths operate on the same principle. Where a single option group branches from a preceding group, the user is restricted to the selection of an option choice within the group. If, however two groups branch from a previous group, the selection of an option in one group or the other will cause the user to follow an alternate logic path.

The master logic paths operate by guiding the user through several option decisions. The user is prompted to input various design parameters. The order of questioning, and the allowable responses, are controlled by the specific path taken along a master logic path.

The master logic paths reference and utilize the two types of paths: insulation paths and the product selection paths. The insulation paths are indicated by the letter I followed by an indicating subscript; the product selection paths are represented by the use of double letters.

Insulation Selection Paths

The master logic paths specify particular option choices that lead to the selection of a specific system, or group of allowable systems.

In some instances the master path guides the user to a selected insulation path. An example of this can be seen in FIG. 2E. In this figure, all the master paths lead to the selection of a particular insulation path. The determination of a product selection path is not made in the master path in this instance. For these cases the selected insulation path will end with the determination of the appropriate product selection path.

In alternate cases, as shown in FIG. 2F, the previous selections made by the user result in the selection of both the insulation path and the product selection path. In these instances, the invention branches from the master path to the insulation path and then to the product selection path previously chosen by the master path.

It is not required that both an insulation path and a product selection path be utilized by the system of the invention in the creation of a master logic path. For example, in FIG. 2B the selection by the user of a guarantee duration and a slope results in the determination that a particular product selection path will be followed. Since insulation is improper for this particular application, the insulation paths are not employed.

In some cases neither insulation paths nor product selection paths are used. In FIG. 3A-3B, the master logic paths for a Recover without insulation are shown. In this instance the path branch selection is governed solely by the user's selection of specific option groups. No insulation paths or product selection paths are employed by the invention in this case.

Referring to FIGS. 2E-2H, it is shown that once the user has selected either New or Tear-off construction and a steel deck type, the user can choose from any of the group options in option category A—Guarantee. Once the selection of a guarantee duration is made, the user is queried as to the use of a gypsum board. For example if a fifteen year guarantee was selected, A2, the user would be able to choose from option groups B1, B2, or B3 concerning the slope. Once a slope was selected, B2 for example, the user would be required to select between use or nonuse of a gypsum board. If a gypsum board was to be used, the user would then be questioned concerning the use of a vapor retarder. If a vapor retarder was selected, the use of insulation path I104 and product selection path TT would be dictated by the logic of the master logic path.

Figure 4A:
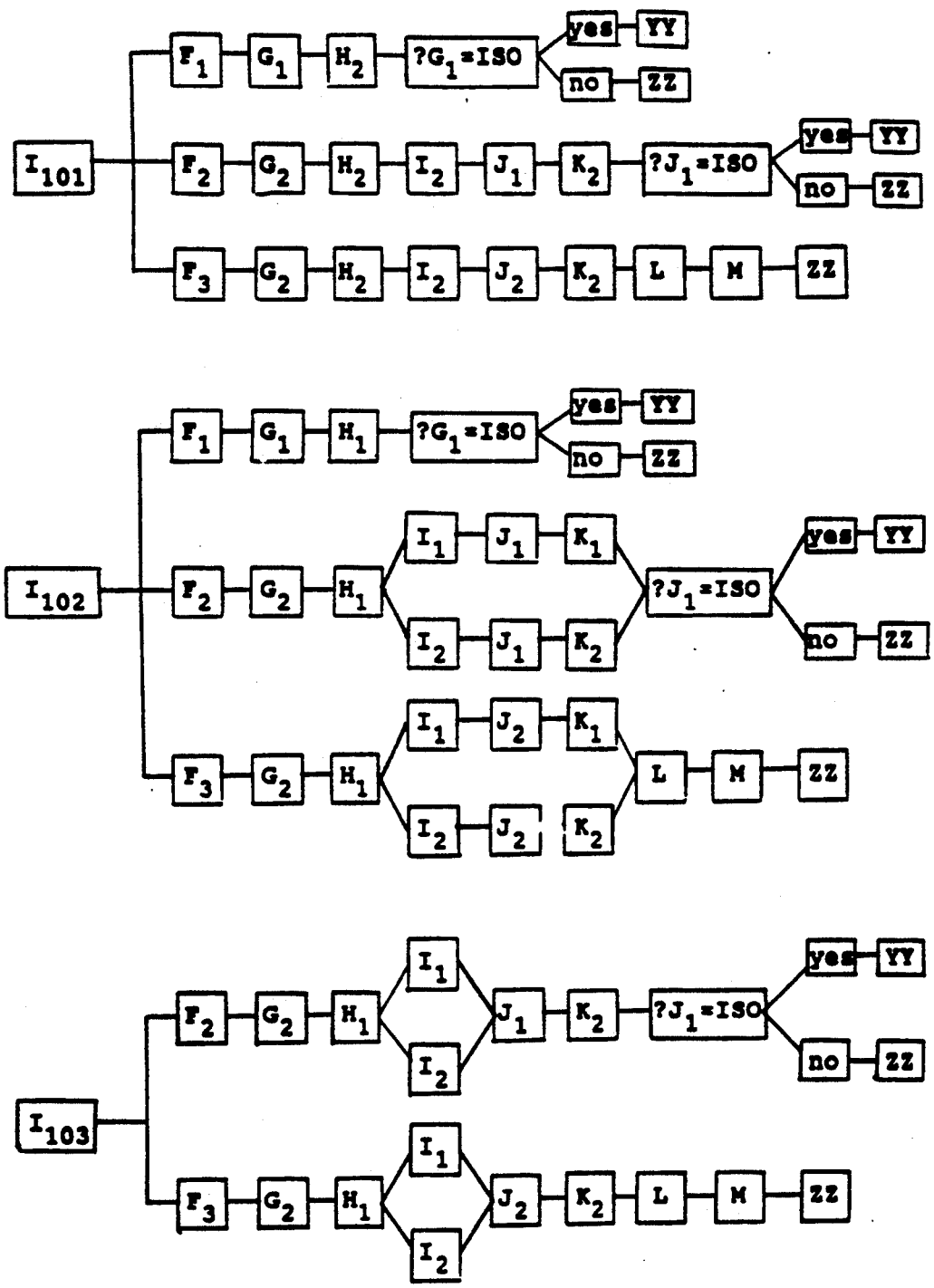
FIGS. 4A-4C illustrate the insulation selection logic paths.
Figure 4B:
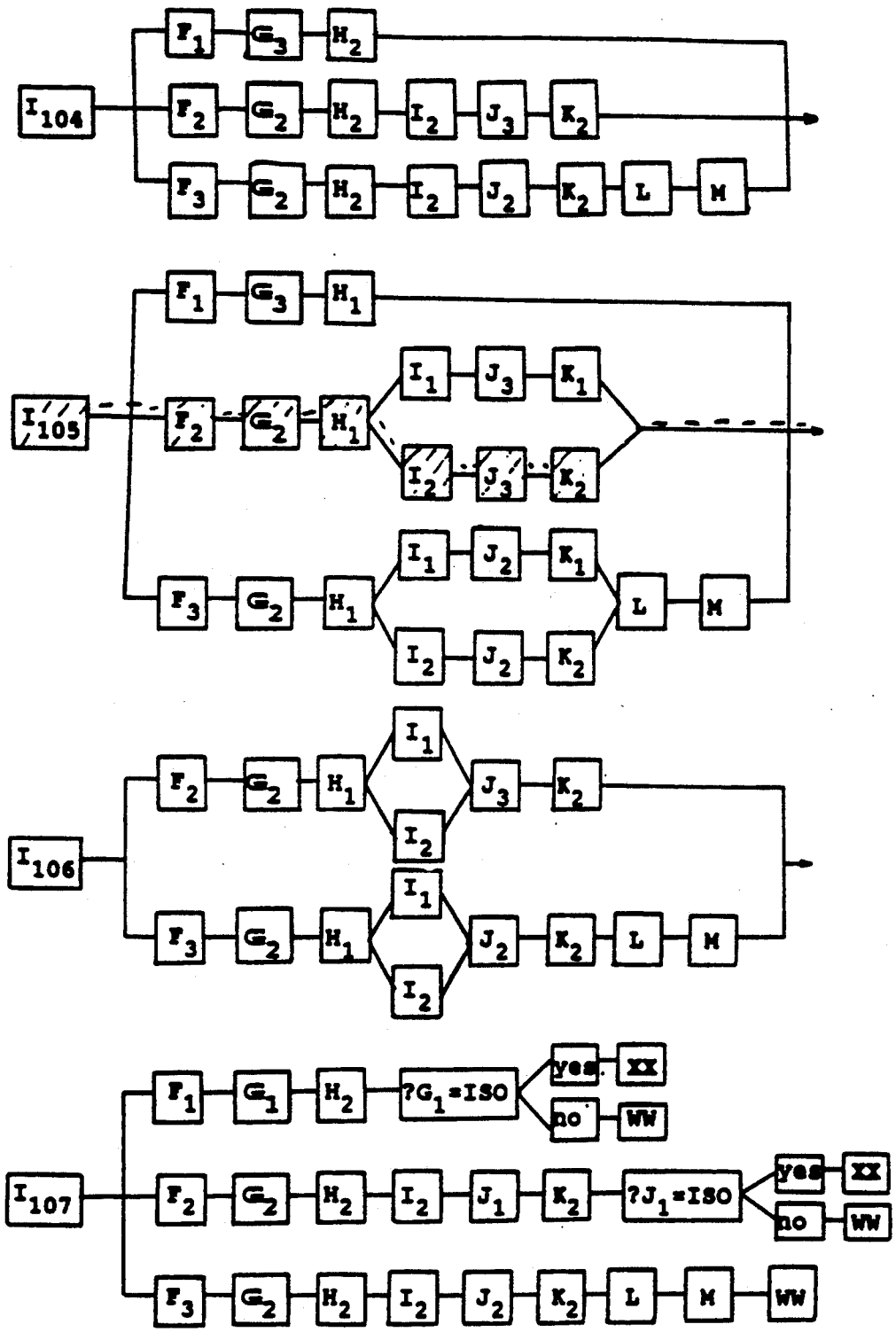
Figure 4C:
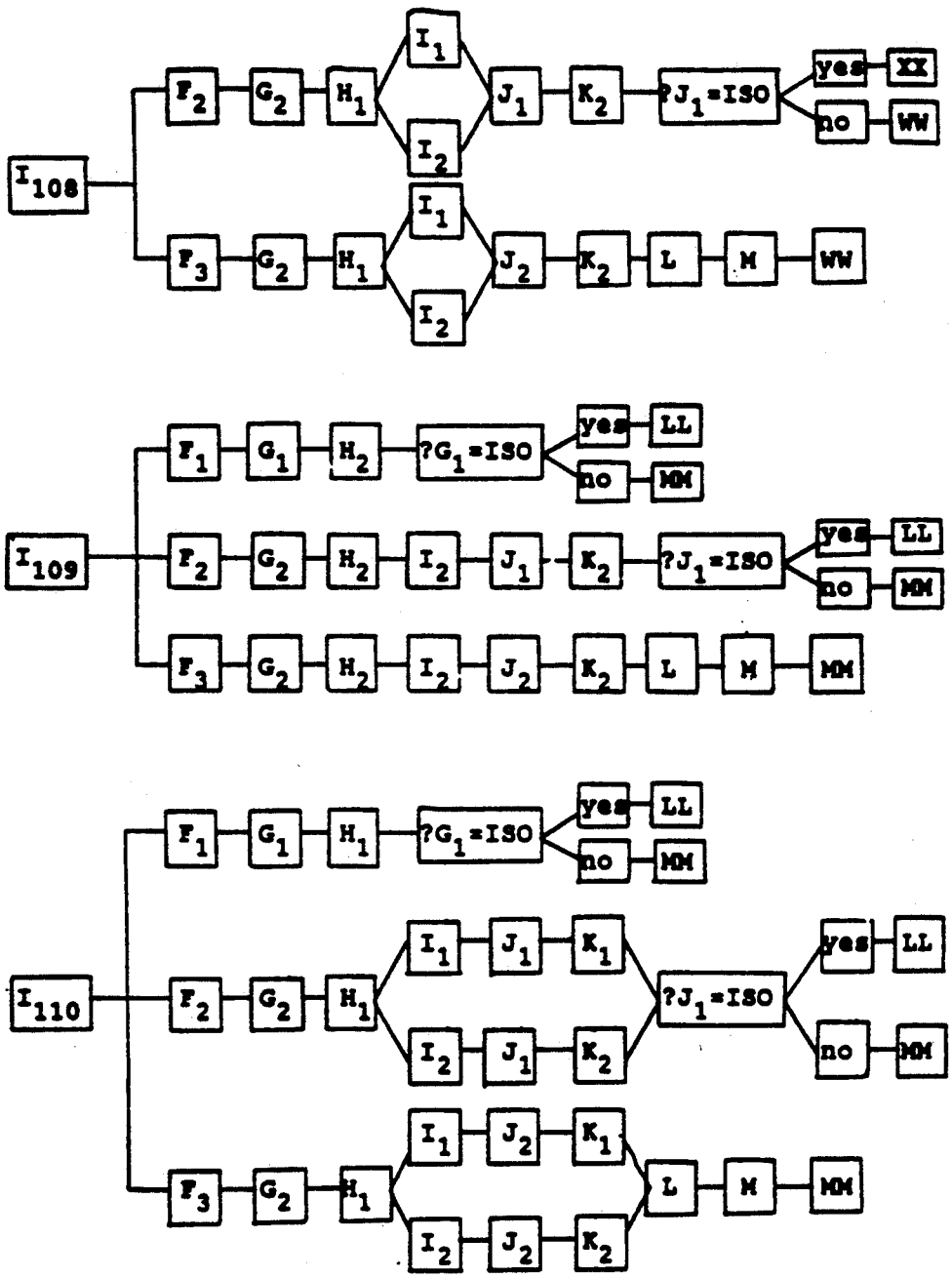

The insulation selection paths are illustrated in FIGS. 4A-4C. These paths are utilized to select the appropriate number of insulation layers, as well as the desired method of attachment. Other options, such as the insulation material to be used, are selected by following the insulation paths.

These paths operate in the same manner as previously described for the master logic paths with one addition. As with the master logic paths, the insulation paths restrict the user to a selection from a particular option group if only one group branches from a previous one and follow a new logic path if a choice between groups is offered. In addition to making branch decision based on the option groups, the insulation paths utilize the specific option choices within the option groups.

For example, in FIG. 4A, following insulation path I101, the top path branches on the basis of the specific choice made from option group G1 (i.e., did the user select isocyamurate?). As can be seen in FIGS. 4A-4C, there are several instances where decisions are made on the basis of the particular option choice selected.

Each of the ten insulation paths begins by requiring the user to select from a specific number of option groups within option category F, Layers of Insulation. Once this decision is made, the user is guided through the appropriate questions as indicated by the particular insulation logic path followed. In most instances the insulation paths culminate in the determination of the appropriate product selection path. In the instances for which this is not the case, I104 and I105, the master logic path, which referenced the insulation path, indicates the proper path to be followed.

For example, if insulation path I107 is selected by the master logic path, the user will be required to select either 1, 2 or 3 layers of insulation representing option groups F1, F2, and F3 respectfully. The option group F4, no insulation layers, is not provided to the user as an acceptable choice, as it would not be proper in this particular application.

If, for example, three layers of insulation were selected, F3, the user would be limited in his selection of the material of the first layer to the option choices in option group G2. Further, the user would be required by the path logic to use hot asphalt attachment, H2, as well as hot asphalt attachment chosen I2. The user would then be given a choice of second layer materials from option group J2 and directed toward hot asphalt attachment, K2. The third layer selection must be made from option group L, and the attachment must be hot asphalt, option group M. The insulation path would then guide the user to product selection path WW.

Product Selection Paths

The product selection paths are shown in FIG. 5A-5E. Each of these paths guides the user to an option group comprising available roofing systems (e.g., option categories R, Built-up roofing systems, and U, Modified asphalt roofing systems). It is from these option categories that the final system selection will be made.

The product selection paths operate in the same manner as the master logic paths and the insulation paths.

Roofing Selection System

As exemplified in FIG. 5B, the product selection paths lead to the ultimate selection of a roofing system. Once this selection is made, the final specifications can be prepared.

For example, if product selection path PP was selected by either the master logic path or the insulation selection path, the user would be forced to choose between a Built-up roofing system, N1, and a Modified asphalt system, N2. On the basis of this decision the user would be questioned about the desired attributes of the selected system. If a Modified asphalt system, N2, was selected the user would be questioned concerning the intended application type. Assuming heat weld, S1, was selected the user would be guided to Premium asphalt type, T1, and would be given a choice of the various systems available in option group U15.

It is therefore appreciated that through the use of the various logical paths, the selection of the appropriate roofing system can be accomplished by the present invention.

Machine Generation of Roofing Specification

Each potential specific roofing system that is recognized by the system of the invention is associated with a specific master specification. Each master specification contains general information concerning the roofing system as well as specific details concerning the installation and use of the system. A complete listing of each master specification can be found in the accompanying Appendix I (microfiche).

In order to customize the master specification associated with the selected roofing system, the system of the invention employs the "customizing labels" as indicated in FIG. 6A-6C. As may be observed, each choice available to the user has been assigned a specific number and a specific letter. For example 4E corresponds to the selection of a twenty year warranty length.

While some of the customizing labels represent choices contained in the option groups and option categories, others do not. For example customizing label 6B represents the desire to utilize a gypsum board. This corresponds to option group C1. Other customizing labels, such as 28A—color, do not affect the system selection and thus have no counterparts in the option groups and categories.

It is important to note that the labels applied to each decision in specification generation are different from those employed in system selection.

The customizing labels are applied to the user responses to requests for information occurring in connection with the system selection. Further, the system of the invention may systematically request the user to input data representing design features which do not affect the selection of the roofing system (e.g., color). Each choice made by the user is converted to a customizing label and these labels are retained for the purpose of specification generation.

The data determining the specific modifications be made to the master specifications is contained in various groupings entitled "Specmods". Each specmod is associated with several roofing specifications. Thus when a roofing specification is selected so too is the corresponding specmod.

Each specmod contains modifications that correspond to the various customizing labels. When a system, and therefore the associated specmod, is selected, the data representing the customizing labels is compared with the data representing the specific modifications. When a match is made, the user is informed of the changes that are required in the master specification. In this manner, the invention allows for the generation of specifications corresponding to the design criteria supplied by the user. A complete listing of all the specmods, the master specifications to which they correspond, and the modifications contained within, can be found in accompanying Appendix II (microfiche).

A more detailed understanding of the present invention may be obtained by reference to FIGS. 7A-7H and FIGS. 8A-8E, FIGS. 7A-7H and FIGS. 8A-8E illustrate the logic paths that may be followed in using the invention. Each of the paths contain blocks which represent option categories. Upon selection of a particular option by the user, the paths will diverge and combine until reaching a final state of "Done".

FIGS. 7A-7H represent possible logic paths for both new and tear-off construction. FIGS. 8A-8E represent the possible logic paths for recover construction.

It is important to note that several questions are illustrated in FIGS. 7A-7H and 8A-8E which are not represented in either the option categories on the master logic path diagrams. As previously discussed, these questions have no effect on the selection of the final system, but do affect the final specification. Thus in a preferred embodiment of the invention questions having no bearing as to the selection of the system may be added to customize the invention to a specific user.

As can be observed in these figures, each large box corresponds to a specific option category. Those boxes which do not represent an option category have no effect on the system selection.

In the preferred embodiment of the invention, the logic paths and the specification generation means are implemented using a programmable digital computer.

As one skilled in the art with the benefit of this disclosure will recognize, the method illustrated in the figures and described in the specification may be implemented in various forms.

Example: New Construction/Tear-off

An example of system selection and specification generation is illustrated in FIGS. 9A-9B, and Appendix III. FIG. 9A illustrates the design features selected by the user in this example. The logic paths followed in the example are illustrated by dashed lines in the FIGS. recited below.

The user is first asked to indicate which type of construction is desired. For this example it will be assumed that the user has selected a new construction application. Thus, reference must first be made to FIGS. 7A-7B. As illustrated in those figures, the user is prompted by the system to select the roof deck. For the purposes of example, a steel deck will be chosen.

Having selected both the construction type and the deck type, reference can be made to FIGS. 2E-2H which represent the master logic paths for these options. As FIGS. 7A-7B and FIGS. 2E-2H indicate, the user will then be required to select from option category A—Guarantee. In the example, the user selects a 15 year guarantee; option choice A2. Thus the master logic paths illustrated in FIG. 2F will be selected.

Figure 7A:
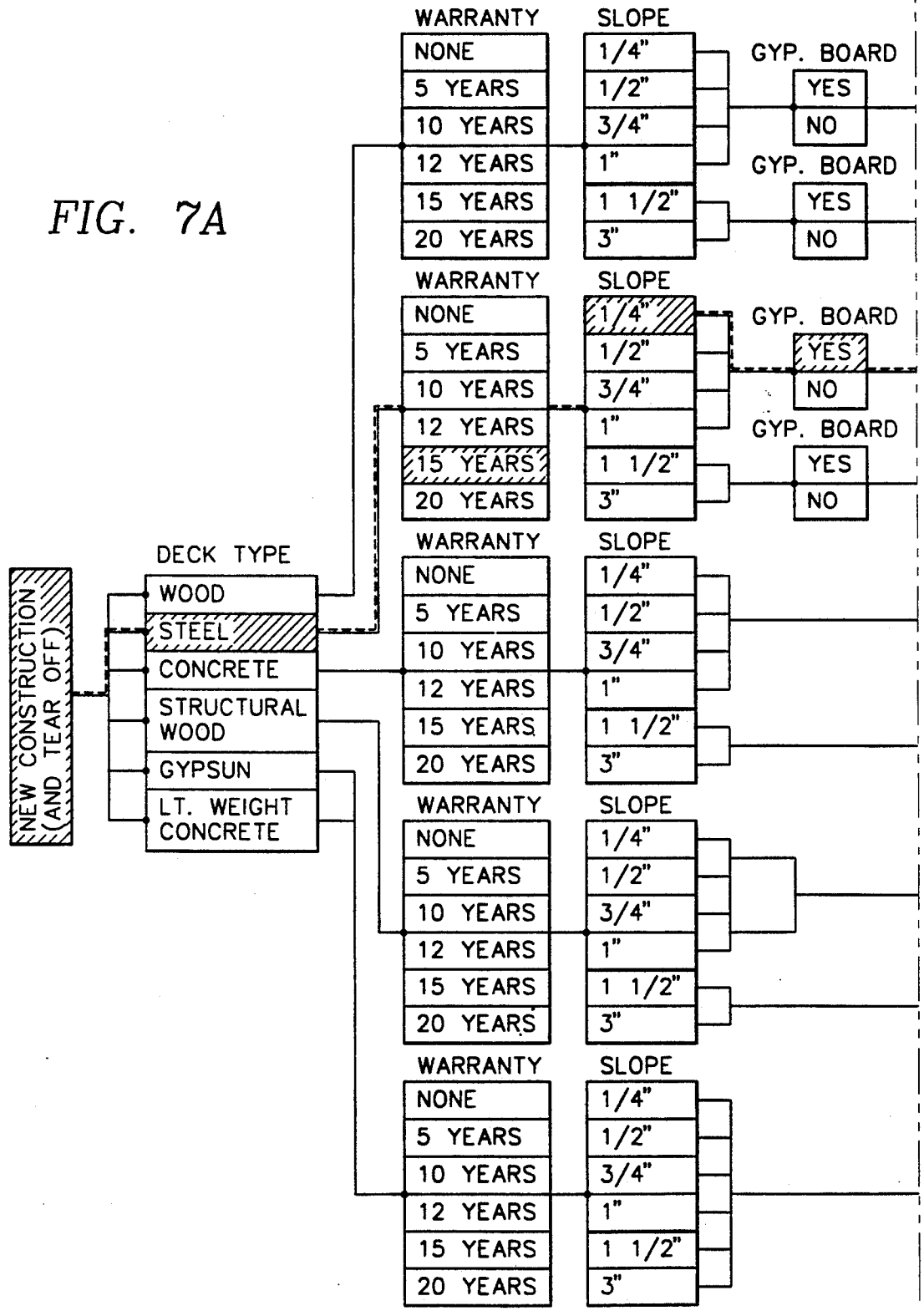
Figure 7B:
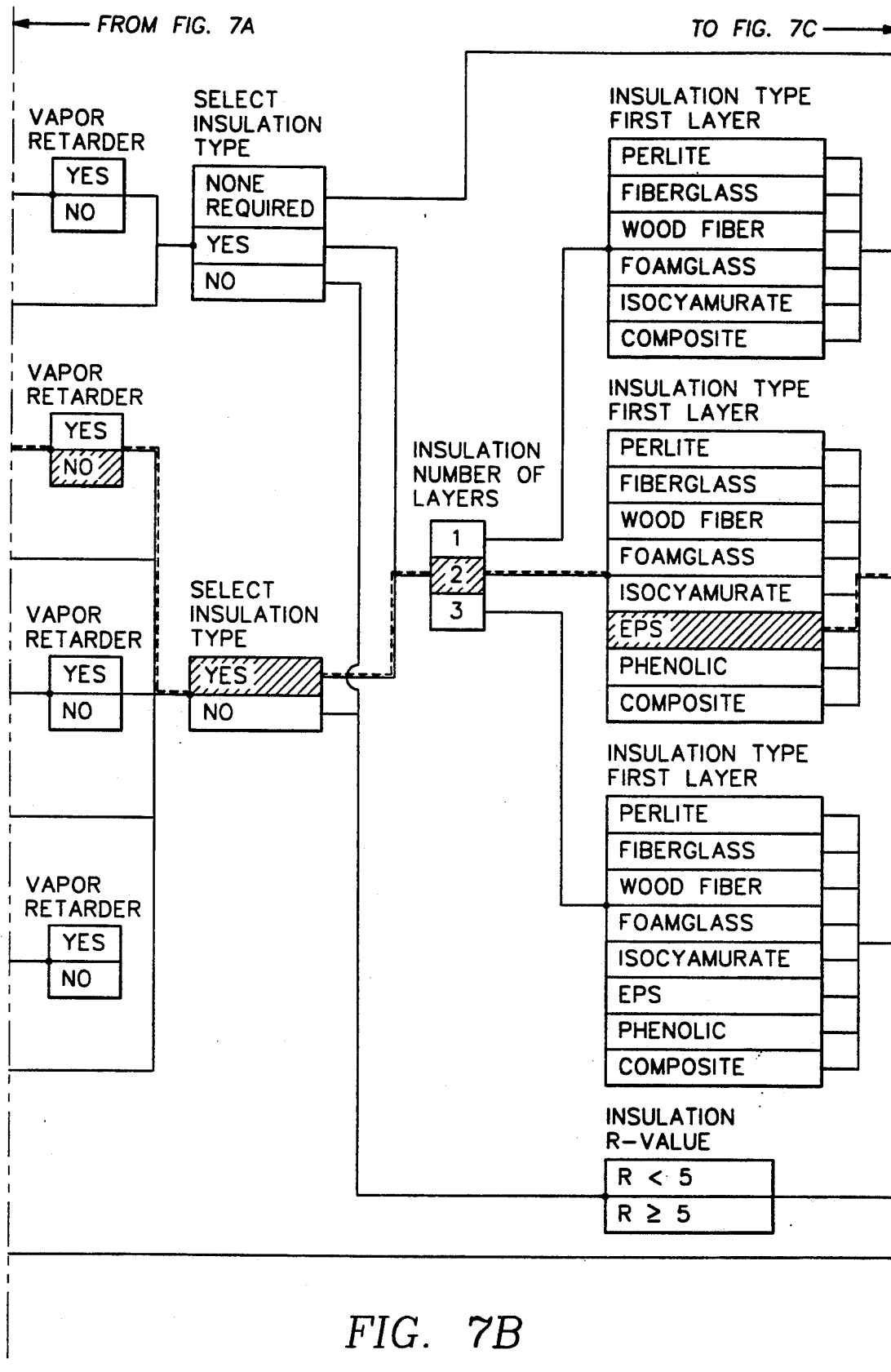
Figure 7C:
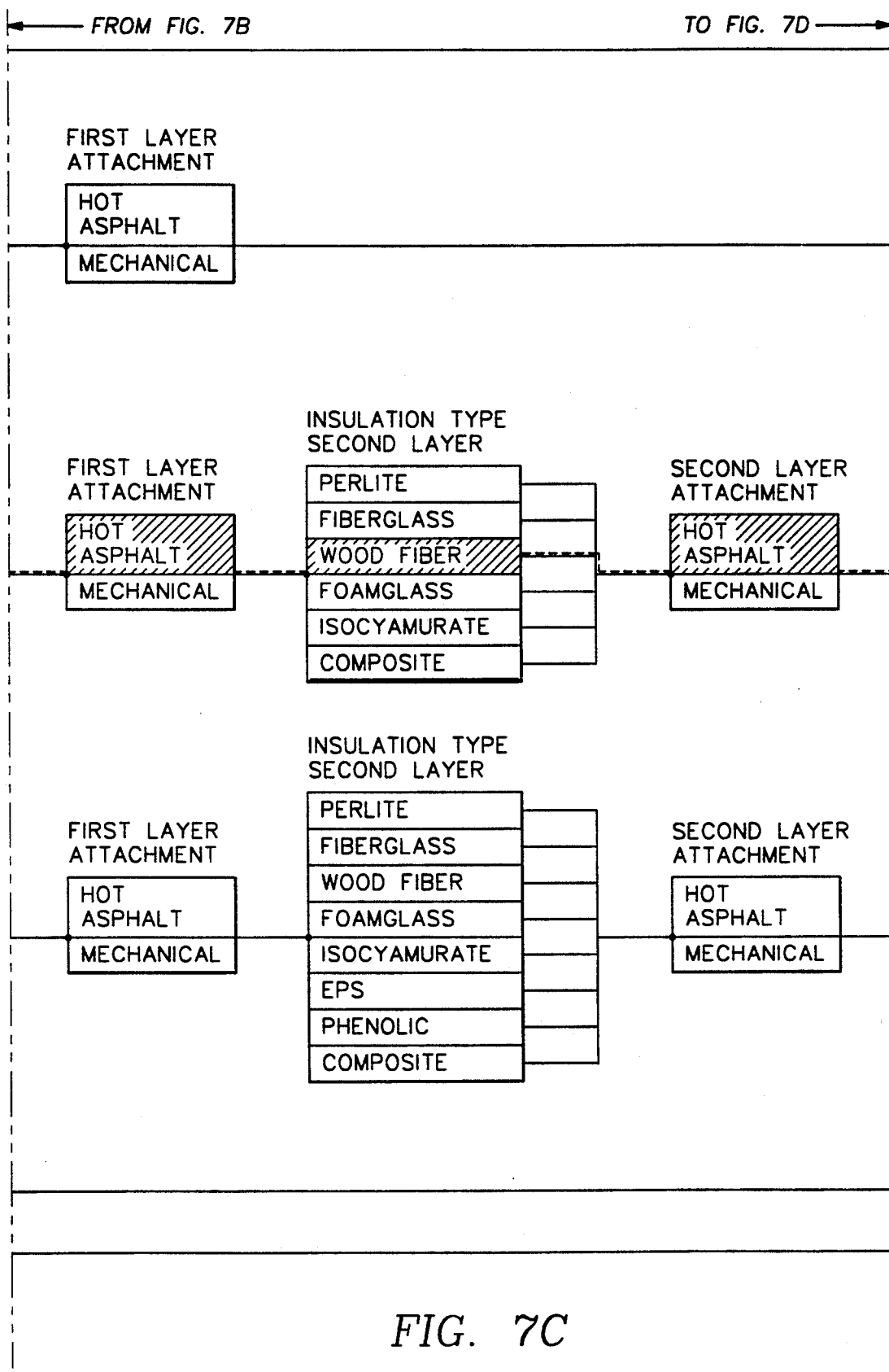
Figure 7D:
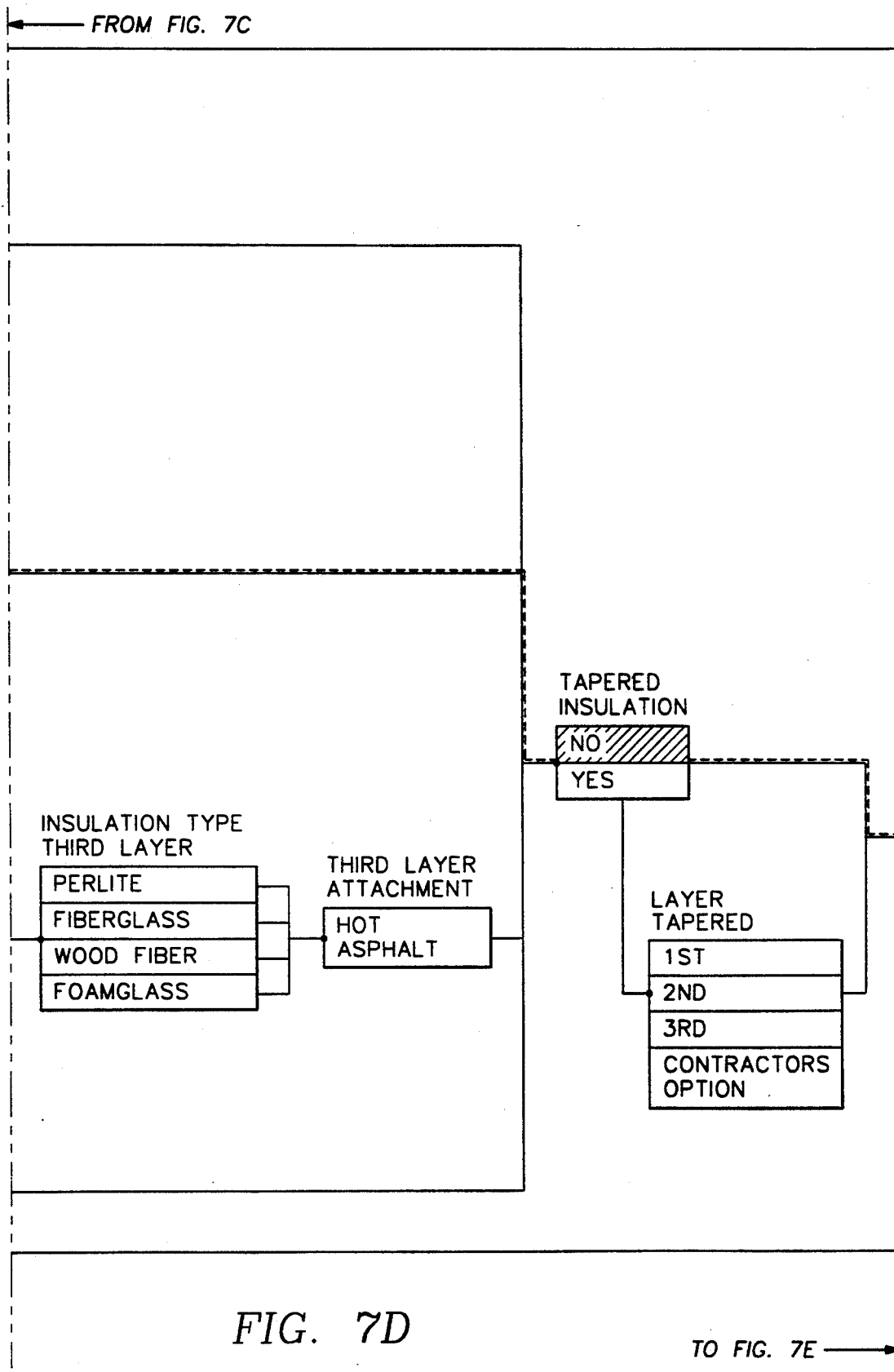
Figure 7F:
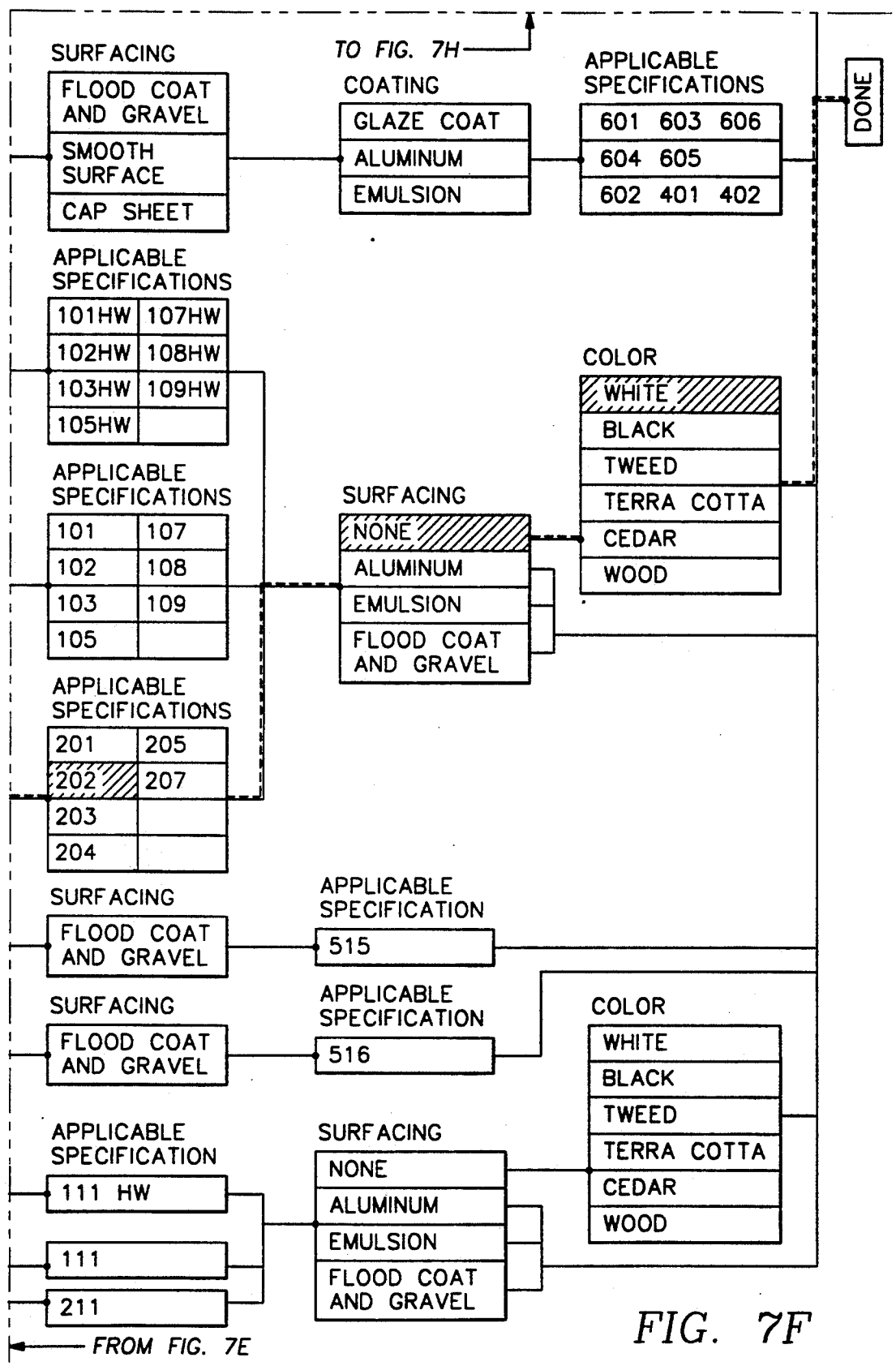
Figure 7G:
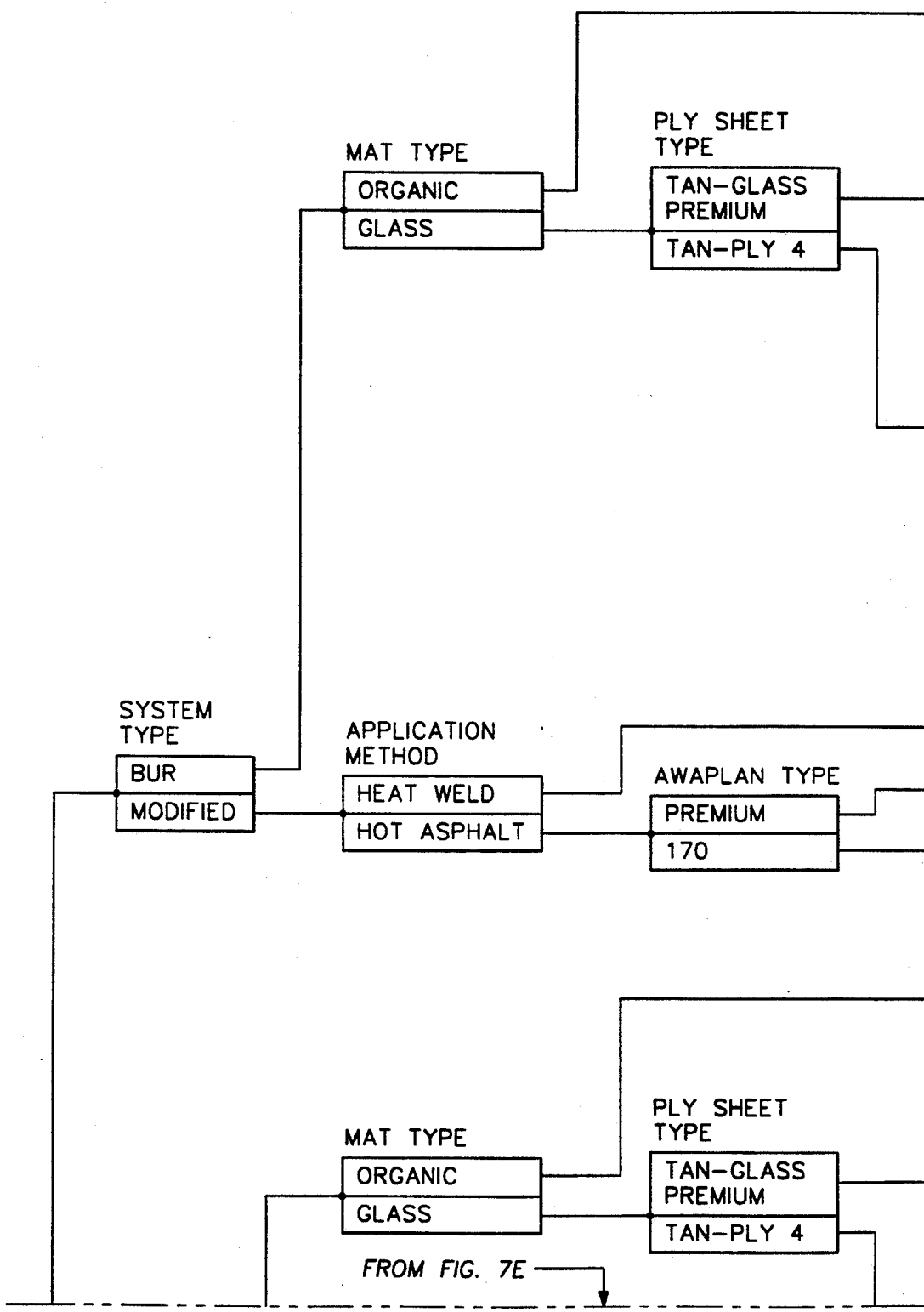
Figure 7H:
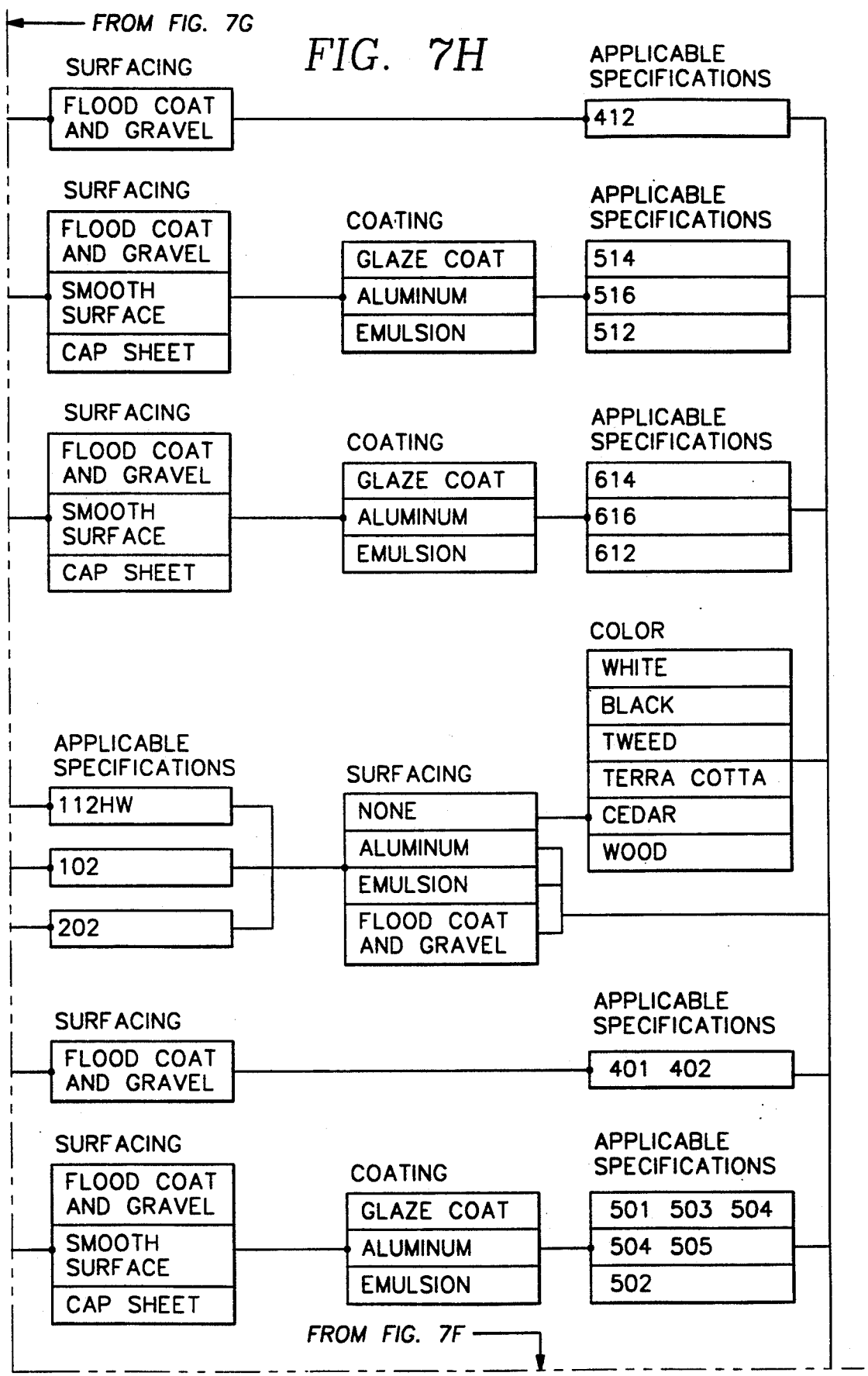
Figure 8A:
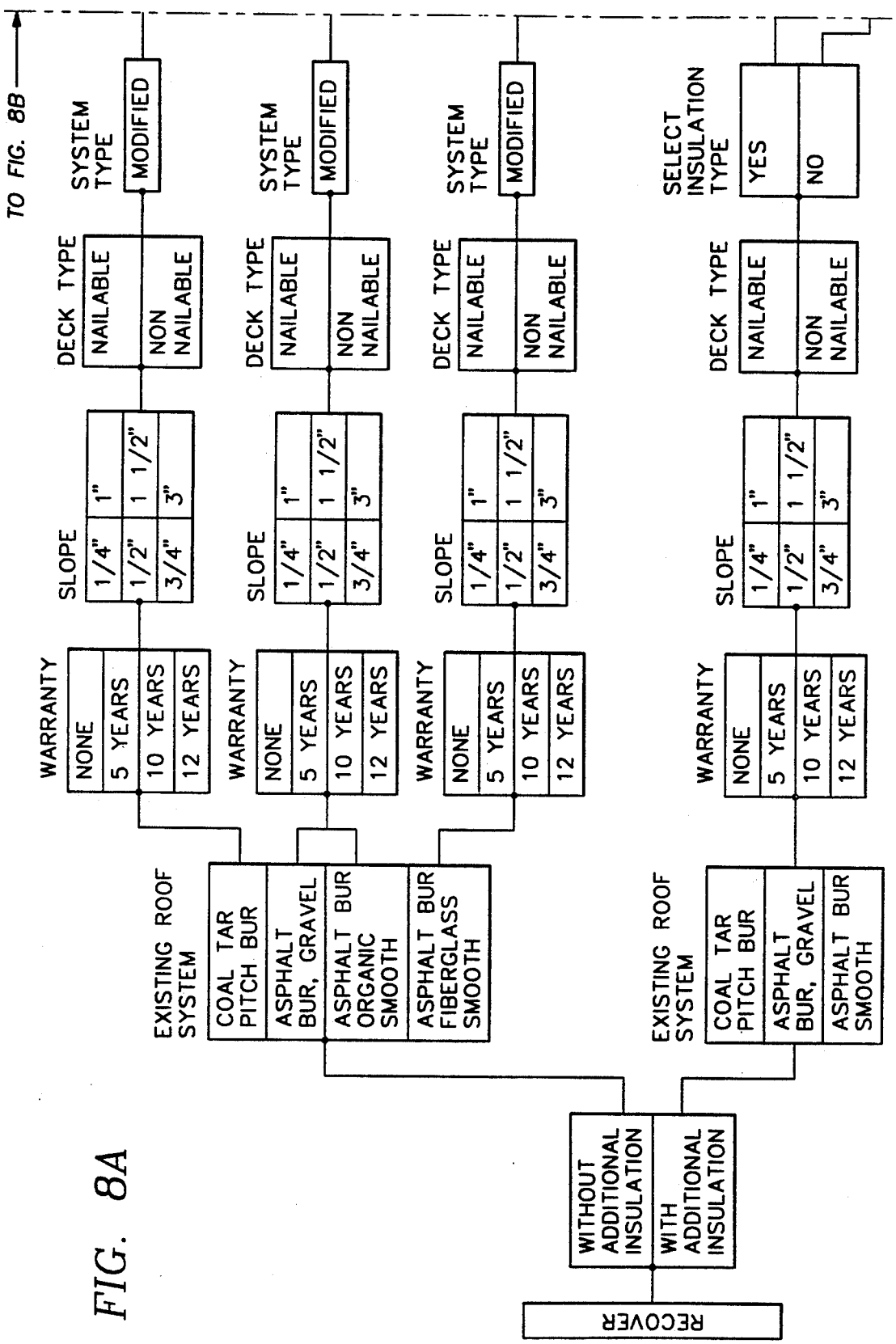
Figure 8B:
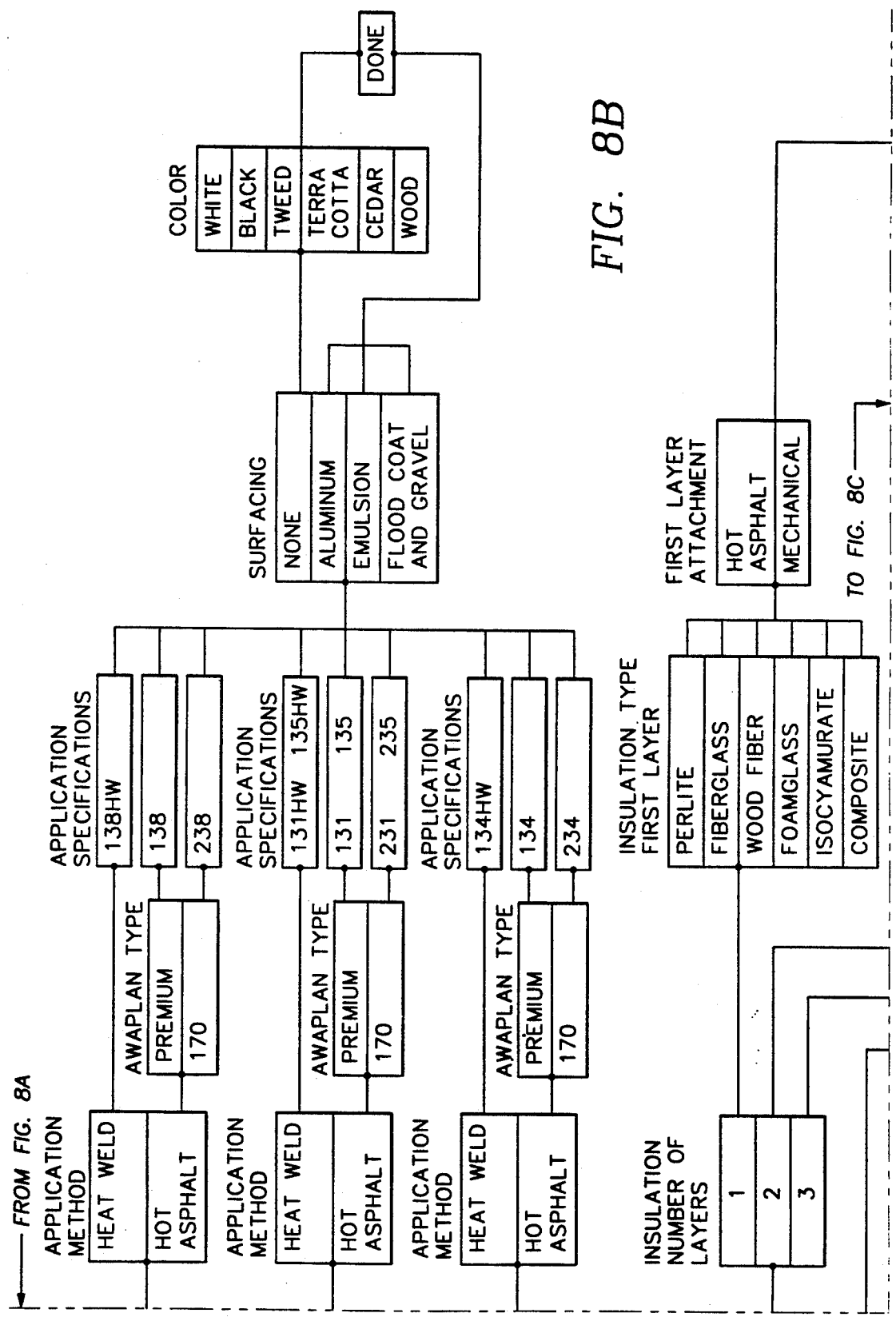
Figure 8C:
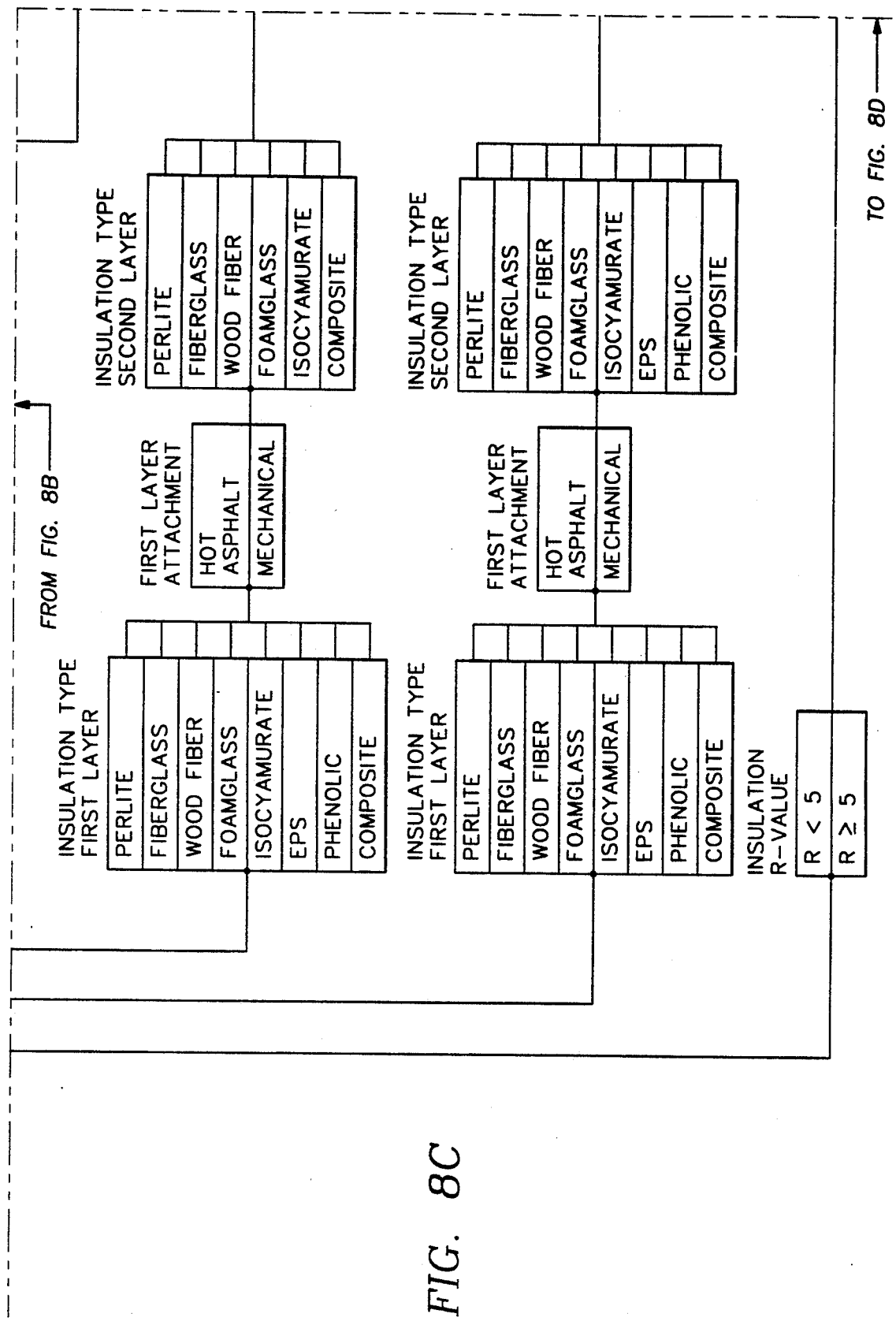
Figure 8E:
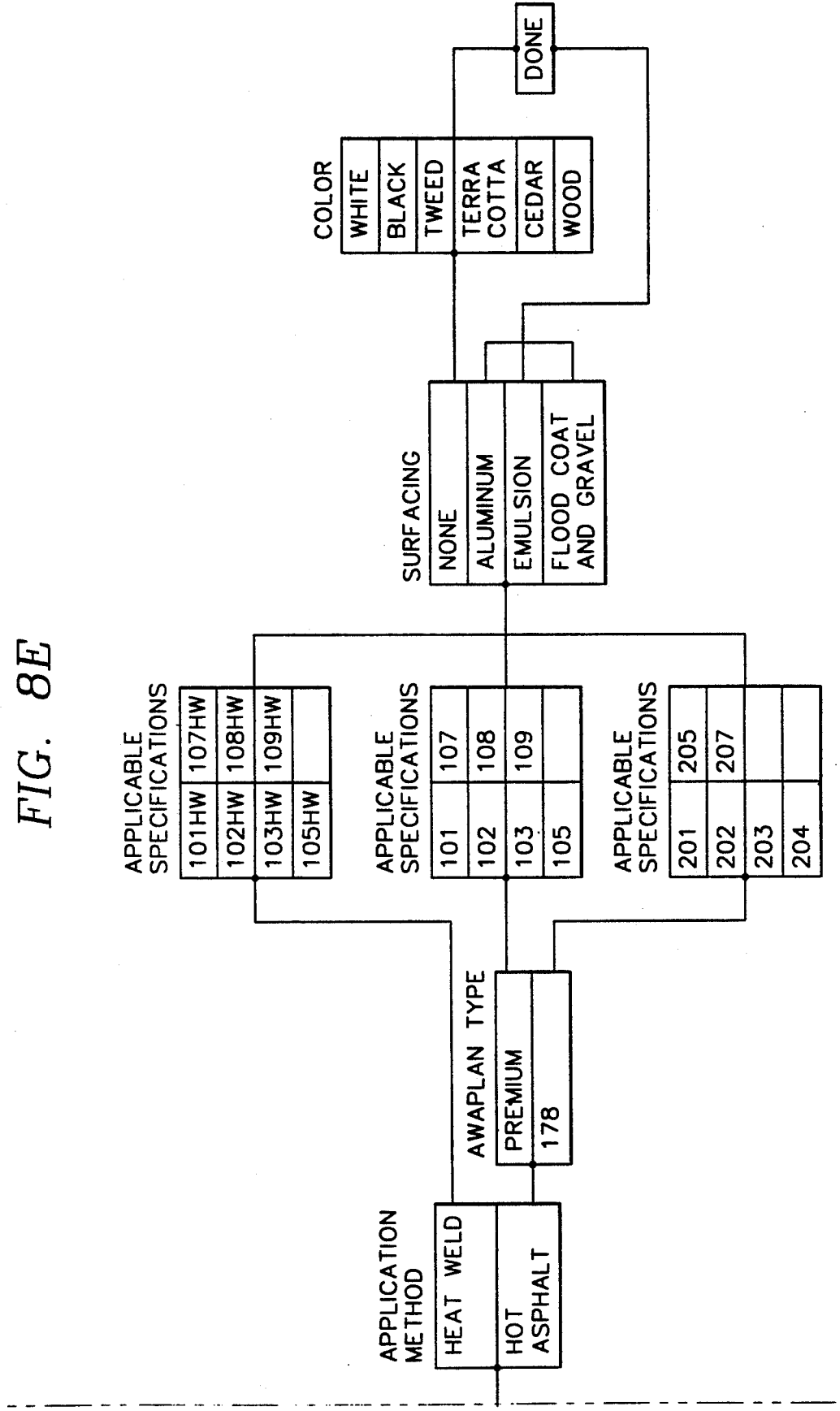

As shown in FIGS. 7A-7B, the user is now required to select a choice from option category B—Slope. The master logic path shown in FIG. 2F indicates, however, that all options are not available to the user. Only choices from option categories B1, B2 and B3 are allowed. A selection from either B4 or B5 would be improper and thus the user is prevented from making a selection that is within these groups.

Choosing a slope of ¼", from option group B1, the user is next questioned as to whether a gypsum board is desired. In the example the user selects yes, C1. Thus the system of the invention selects the upper logic path in FIG. 2F. The user is then queried as to whether a vapor retarder is desired. Answering no, D2, the system selects the second path of FIG. 2F.

Following the response to the vapor retarder query, the user is asked whether insulation is to be selected. As the answer is yes, insulation path I105 is selected by the system of the invention. Insulation path I105 is illustrated in FIG. 4B.

As can shown in FIGS. 7A-7B, when the user opts to select insulation type, the user is first required to choose from option category F—Layers of Insulation. Choosing 2 layers, within F2, the insulation path then guides the user to make a selections from option group G2. For the purpose of example, the user selects EPS as the first layer of insulation.

Following the selection of the first layer of insulation, the user is queried as to the first layer attachment. As illustrated in FIG. 4B, the users selection from this option group will control the branching of a logic path. In the example, the user selects hot asphalt, I2, and thus the lower branch is selected.

Once this branch is selected, the user is restricted to making his choice of the second layer of attachment from option group J3. For the example, the user is assumed to select woodfiber.

The user is then queried as to the second layer attachment. As illustrated in FIG. 4B, the only acceptable choice is hot asphalt, K2. As the insulation logic path ends reference must be made to the master logic path in FIG. 2F to determine which product selection path will be selected. As the figure illustrates, product selection path VV (FIG. 5D) is selected on the basis of the data previously entered by the user.

Following product selection path VV, the user is first questioned as to the type of system desired. In the example, the user selects Modified Asphalt—N2 (a/k/a Awaplan System). Following the lower logic branch of VV, the user is then queried as to the modified asphalt application type. The example user selects S2—hot asphalt.

The user is then prompted by the system of the present invention to select the modified asphalt type. Here, Premium—T1 is selected.

As the product selection path indicates, once T1 is selected the user is prompted to select an applicable specification from the option group U8. In the example the roofing specification 102 is selected.

Following the selection of the roofing specification 102, the user is requested to enter data representing certain desired design features (e.g., surfacing, color). Since the selection of these features does not affect the selection of the roofing system, these choices are not illustrated in product selection path W.

From the information obtained in the questioning, a detailed specification may be generated by the invention. As discussed, this is accomplished in the system of the present invention by assigning a customizing label to each of the user's response as indicated in FIGS. 6A-6C. A list of the custom labels generated from the users responses to the queries in the preceding example is as follows:

| | |
|---|---|
| New Construction - 1B | Steel Deck - 3A |
| Fifteen Year Warranty - 4D | ¼" Roof Slope - 5A |
| Gypsum Board - 6A | Vapor Retarder - 7B |
| Select Insulation Type - 8A | Two Insulation Layers - 9B |
| EPS First Layer - 10C | Hot Asphalt Attachment 1st Layer-11B |
| Woodfiber Second Layer Insulation - 12B | Hot Asphalt Attachment 2nd layer - 13B |
| No Tapered Insulation - 19B | Modified Asphalt (Awaplan System) - 21A |
| Hot Asphalt Attachment - 22B | Premium Modified Type - 23A |
| 102 Specification - 25B | No Surfacing - 27A |
| White Color - 28A | |

The generated custom labels are then compared to the specification-modifications in Spec-Mod A. Specmod A is utilized since it corresponds to specification 102, which was selected by the user. A listing of the unmodified master specification for specification 102 may be found on page 23 of Appendix I. A complete listing of the SpecMod A modifications may be found on page 998 of Appendix II.

If a custom label matches one of the modifications in Spec-Mod A, the associated modification is generated by the system of the invention. An example of the modifications generated from the previous example is given in FIG. 9B. A final specification may then be generated by making the appropriate modification to master specification 102. The complete machine generated specification for the example is contained in Appendix III.

It is clear from the preceding description and examples that the present invention provides for a method of selecting a roofing system which will reduce the possibility of user error. Further, the invention allows the generation of detailed specifications corresponding to the selected system.

APPENDIX III
EXAMPLE SPECIFICATION
SECTION 07525
MODIFIED BITUMINOUS SHEET ROOFING

PART 1 GENERAL
 1.01 SECTION INCLUDES
  A. Sheating over deck surface.
  B. Roof insulation.
  C. Membrane roofing with base flashings.
  D. Roof walkways.
 1.02 RELATED SECTIONS
  A. Section ___-___: Roof deck surface substrate.
  B. Section ___-___: Wood nailers and cants.
  C. Section 07620 - Sheet Metal Flashing and Trim: Weather protection to base flashings.
  D. Section ___-___: Roof drains, sumps or hoppers.
 1.03 REFERENCES
  A. ANSI/ASTM C707 - Gypsum Board Substrate for Floor or Roof Assemblies.
  B. ANSI/ASTM D41 - Asphalt Primer Used in Roofing, Dampproofing, and Waterproofing.
  C. ANSI/ASTM D95 - Standard Test Method for Water in Petroleum Products and Bituminous Materials by Distillation.
  D. ANSI/ASTM D146 - Sampling and Testing of Bitumen-Saturated Felts and Woven Fabrics for Roofing and Waterproofing.
  E. ANSI/ASTM D312 - Asphalt Used in Roofing.
  F. ANSI/ASTM D1204 - Test Method for Linear Dimensional Changes of Non-Rigid Thermoplastic Sheeting at Elevated Temperature.
  G. ANSI/ASTM D2178 - Asphalt Impregnated Glass (Felt) Mat Used in Roofing and Waterproofing.
  H. ANSI/ASTM D2523 - Load Strain Properties of Roofing Membranes.
  A. Conform to applicable code for roof assembly fire hazard requirements.
 1.07 PRE-INSTALLATION CONFERENCE
  A. Convene prior to commencing work of this Section. Meet at project site with Installer, roofing manufacturer, installers of related work, Architect, and Owner.
  B. Review installation procedures and coordination required with related Work.
 1.08 DELIVERY, STORAGE, AND HANDLING
  A. Deliver products in manufacturer's original containers, dry, undamaged, seals and labels intact.
  B. Store products in weather protected environment, clear of ground and moisture. All waterproof tarps shall be opaque.
  C. Stand roll materials on end, with labels right side up.
 1.09 ENVIRONMENTAL REQUIREMENTS
  A. Do not apply roofing membrane during inclement weather or ambient temperatures below 40 degrees F. including wind chill factor.
  B. Follow manufacturer's special recommendations for installations below 50 degrees F.
  C. Do not apply roofing membrane to damp or frozen deck surface.
 1.10 WARRANTY
  A. Provide 15 year warranty from roofing manufacturer. Warranty shall cover leaks whick result from either material or workmanship defects, shall not be subject to a deductible, and shall not be pro-rated. Warranty coverage shall include repairs to the roofing system to the extent necessary to return the roofing system to a water tight condition.
  B. Installer to provide standard two-year workmanship warranty.
PART 2 PRODUCTS
 2.01 MANUFACTURERS - SHEET AND BITUMEN MATERIALS
  A. TAMKO Asphalt Products Spec 102 AWAPLAN PREMIUM.
  B. Substitutions: An equal system of manufacturer approved by Architect under provisions of Division 1.
   2. Insulation shall be approved by Factory Mutual and Underwriters Laboratories for use as a roofing insulation.
   3. Any of the insulations listed below are acceptable. If more than one are listed, Installer shall have the option of determining which to use.
   4. Minimum five-year aged R-Value of Insulation Only: R-10
  B. First Layer:
   1. Expanded Polystyrene:
    a. ASTM C-578, Type VIII.
    b. Processed from modified EPS resin. Proof of modified material must be maintained by a Society of Plastics Industry (SPI) third party certification and labeling program.
    c. Minimum 7-day aging.
    d. Minimum Thickness: 2 in.
  C. Top Layer:
   1. Wood Fiberboard:
    a. FS LLL-I-535, ASTM C-208
    b. Minimum Thickness: ½ in.
 2.07 BASE FLASHINGS
  A. General Requirements:
   1. Base flashing materials shall be compatible with roofing membrane and produced by the same manufacturer.
   2. Any of the base flashings listed below are acceptable. If more than one are listed, Installer shall have the option of determining which to use.
  B. TAMKO "AWAPLAN PREMIUM", U.L. B/U Label, 250 grams/square meter polyester mat, SBS modified asphalt-coated, 160 mils thick, surfaced with ceramic granules, 101 lbs./1 square roll minimum. Color shall be selected by Architect from manufacturer's standard colors.
  C. TAMKO "AWAPLAN PREMIUM Heat Welding", U.L. B/U Label, 250 grams/square meter polyester mat, SBS modified asphalt-coated, 200 mils thick, surfaced with ceramic granules, 94 lbs. per ¾ square roll minimum. Color shall be selected by Architect from manufacturer's standard colors.
 2.08 CANTS
  A. Fiber Cant and Tapered Edge Strips: Asphalt impregnated wood fiberboard, preformed to 45 degree angle. Do not use with heat welding application of base flashings.
  B. Wood Cants: Specified in Division 6.
  B. Verify deck is supported and secured.
  C. Verify deck is clean and smooth, free of depressions, waves, or projections, and properly sloped.
  D. Verify deck surfaces are dry and free of snow or ice.
  E. Verify roof openings, curbs, pipes, sleeves, ducts, and vents through roof are solidly set, and cant strips, nailing strips, and reglets are in place.
 3.03 GYPSUM SHEATHING APPLICATION - METAL DECK
  A. Mechanically fasten gypsum sheathing to metal deck in accordance with UL or FM requirements.
  B. Lay with long side at right angle to flutes of deck; stagger end joints; provide support at ends.
  C. Cut sheathing cleanly and accurately at roof breaks and protrusions to provide smooth surface. Tape joints.
 3.04 INSULATION APPLICATION (TWO LAYERS)
  A. Embed two layers of insulation into uniform mopping of hot bitumen in accordance with insulation manufacturer's instructions. Lay second layer of insulation with joints staggered from first layer.
  B. Lay insulation boards with edges in moderate contact without forcing. Cut insulation to fit neatly to perimeter blocking and around penetrations through roof.
  C. Apply no more insulation than can be sealed with membrane in same day.
  D. Tape joints of top layer of insulation in accordance with insulation manufacturer's instructions.
 3.05 REINFORCING PLY APPLICATION FOR SLOPES UP TO AND INCLUDING ¾ INCH PER FOOT
  A. Install 2 plies of asphalt impregnated glass fiber felt in solid moppings of specification asphalt. Starting at -continued APPENDIX III
EXAMPLE SPECIFICATION
SECTION 07525
MODIFIED BITUMINOUS SHEET ROOFING the low point of the roof, install a 19 inch width, then a full 36 inch width, and follow with full 36 inch widths, shingle fashion, lapping each ply 19 inches, in such a manner that at least 2 plies cover the insulation at any one point. Install at right angles to the slope of the roof. Apply bitumen at 23 lbs/square (+/− 15 percent).

3.10 CLEANING
  A. In areas where adjacent finished surfaces are soiled by work of this Section, consult manufacturer of surfaces for cleaning advice and conform to their documented instructions.
  B. Repair or replace defaced or disfigured finishes caused by work of this Section.

3.11 PROTECTION
  A. Protect building surfaces against damage from roofing work.
  B. Where traffic must continue over finished roof membrane, protect surfaces.

-END OF SECTION-

We claim:

1. An automated, machine-implemented method for selecting for a user a roofing system and generating a corresponding specification using a stored data processor which comprises the steps of:
  (a) directing a first group of questions to the user from a master flow logic path, receiving a first group of answers to the first group of questions and storing the first group of received answers;
  (b) selecting an insulation selection logic path in response to the first group of received answers;
  (c) directing a second group of questions to the user from the selected insulation selection logic path, receiving a second group of answers to the second group of questions and storing the second group of received answers;
  (d) selecting a product selection logic path in response to the first and second groups of received answers;
  (e) directing a third group of questions from the selected product selection logic path to the user, receiving a third group of answers to the third group of questions and storing the third group of received answers;
  (f) selecting a roofing system by following the product selection logic path in response to the first, second and third groups of received answers; and
  (g) generating a final specification associated with the selected roofing system and responsive to the first, second, and third groups of received answers.

2. The method of claim 1 wherein the master flow logic path comprises questions concerning:
  deck type, construction type, guarantee length, roof slope, vapor retarder use and gypsum board use.

3. The method of claim 1 wherein the insulation selection logic path comprises questions concerning:
  layers of insulation and layer attachment.

4. The method of claim 1 wherein the product selection logic path comprises questions concerning:
  system type, built-up roofing type, ply sheet type, and surfacing type.

5. The method of claim 1 wherein the first group of questions from the master flow logic path are directed to the user in the following order:
  (1) one or more questions concerning a deck for the roofing system;
  (2) one or more questions concerning a construction type for the roofing system;
  (3) one or more questions concerning a guarantee duration for the roofing system;
  (4) one more questions concerning a slope for the roofing system;
  (5) one or more questions concerning a gypsum board for the roofing system; and
  (6) one or more questions concerning a vapor retarder for the roofing system.

6. The method of claim 1 wherein the second group of questions from the selected insulation selection logic path are directed to the user in the following order:
  (1) one or more questions concerning a number of layers of insulation for the roofing system;
  (2) one or more questions concerning a first layer of insulation, if the received answers to the previously directed one or more questions concerning the number of layers of insulation indicate that the user selected one or more insulation layers;
  (3) one or more questions concerning the attachment of the first layer of insulation, if the received answers to the previously directed one or more questions concerning the number of layers of insulation indicate that the user selected one or more insulation layers;
  (4) one or more questions concerning a second layer of insulation, if the received answers to the previously directed one or more questions concerning the number of layers of insulation indicate that the user selected two or more insulation layers;
  (5) one or more questions concerning the attachment of the second layer of insulation, if the received answers to the previously directed one or more questions concerning the number of layers of insulation indicate that the user selected two or more insulation layers;
  (6) one or more questions concerning a third layer of insulation, if the received answers to the previously directed one or more questions concerning the number of layers of insulation indicate that the user selected three or more insulation layers; and
  (7) one or more questions concerning the attachment of the third layer of insulation, if the received answers to the previously directed one or more questions concerning the number of layers of insulation indicate that the user selected three or more insulation layers.

7. The method of claim 1 wherein the third group of questions from the selected product selection logic path are directed to the user in the following order:
  (1) one or more questions concerning a system type (built-up roofing or modified asphalt) for the roofing system;
  (2) one or more questions concerning a built-up roofing type (organic or fiberglass), if the received answers to the previously directed one or more questions concerning a system type indicate the user selected a built-up roofing system type;
  (3) one or more questions concerning a ply sheet type, if the received answers to the previously directed one or more questions concerning a built-up roofing type indicate that the user selected a fiberglass built-up roofing type;
  (4) one or more questions concerning a surfacing for the roofing system, if the received answers to the previously directed one or more questions concerning a system type indicate that the user selected a built-up roofing system type;
(5) one or more questions concerning a modified asphalt applications type (heat weld or hot asphalt), if the received answers to the previously directed one or more questions concerning a system type indicate that the user selected a modified asphalt roofing system type;
(6) one or more questions concerning a modified asphalt type, if the received answers to the previously directed one or more questions concerning a modified asphalt applications type indicate that the user selected hot asphalt modified asphalt application; and
(7) one or more questions concerning an applicable modified asphalt roofing system, if the received answers to the previously directed one or more questions concerning a system type indicate that the user selected an asphalt roofing system type.

8. In an automated digital computer, apparatus for selecting a roofing system and generating a corresponding specification from information provided by a user, the apparatus comprising:
(a) means for directing a first group of questions to the user from a master flow logic path, receiving answers to the questions and storing a first group of received answers;
(b) means for selecting an insulation selection logic path in response to the first group of received answers;
(c) means for directing a second group of questions to the user from the selected insulation logic path, receiving answers to the second group of questions and storing a second group of received answers;
(d) means for selecting a product selection logic path in response to the first and second groups of received answers;
(e) means for directing a third group of questions from the selected product selection logic path to the user, receiving answers to the third group of questions and storing a third group of received answers;
(f) means for selecting a roofing system by following the product selection logic path in response to the first, second and third groups of received answers; and
(g) means for generating a final specification associated with the selected roofing system and responsive to the first, second, and third groups of received answers.

* * * * *